United States Patent [19]

Ishiguro et al.

[11] Patent Number: 5,691,643

[45] Date of Patent: Nov. 25, 1997

[54] GROUND FAULT DETECTING APPARATUS AND METHOD FOR DETECTING GROUND FAULT OF FIELD CIRCUIT AND EXCITING CIRCUIT BY DETECTING GROUND FAULT CURRENT FLOWING FROM GROUND TO NEUTRAL POINT OF EXCITING CIRCUIT

[75] Inventors: Takashi Ishiguro, Niiza; Yoshinori Takei, Fuchu, both of Japan

[73] Assignee: Kabushiki Kaisha Toshiba, Kanagawa-ken, Japan

[21] Appl. No.: 539,907

[22] Filed: Oct. 6, 1995

[30] Foreign Application Priority Data

Oct. 11, 1994 [JP] Japan .................... 6-244974

[51] Int. Cl.⁶ .................... G01R 31/06; H02H 7/06
[52] U.S. Cl. .................... 324/510; 324/545; 324/772; 361/42
[58] Field of Search .................... 324/509, 510, 324/511, 545, 546, 772; 340/648, 649, 650, 651; 361/42, 48

[56] References Cited

U.S. PATENT DOCUMENTS 3,831,160  8/1974  Cronin et al. .................... 324/510 X
4,580,186  4/1986  Parker et al. .................... 361/42
4,589,048  5/1986  Takata .................... 361/42
4,667,262  5/1987  Maier .................... 361/42
5,214,575  5/1993  Sugishima et al. .................... 361/42 X

FOREIGN PATENT DOCUMENTS 5-223906  12/1993  Japan .
6-22600   1/1994   Japan .
6-276739  12/1994  Japan .

*Primary Examiner*—Ernest F. Karlsen
*Assistant Examiner*—Diep Do
*Attorney, Agent, or Firm*—Finnegan, Henderson, Farabow, Garrett & Dunner, L.L.P.

[57] ABSTRACT

An apparatus detects a ground fault of an exciting circuit and a field circuit of an AC exciting variable speed rotating machine. The exciting circuit outputs an excited voltage controlled a frequency and/or an amplitude, and the field circuit of the AC exciting variable speed rotating machine is applied a field current by the excited voltage of the exciting circuit. A ground resistance is connected between a neutral point and a ground. The apparatus detects a current flowing from a ground to a neutral point through the ground resistance, and detects the ground fault based upon the detected current. Therefore, the apparatus can detect a ground fault of a field circuit and an exciting circuit of an AC exciting rotating machine during the AC exciting rotating machine operation with certainty.

18 Claims, 22 Drawing Sheets

5,691,643

GROUND FAULT DETECTING APPARATUS AND METHOD FOR DETECTING GROUND FAULT OF FIELD CIRCUIT AND EXCITING CIRCUIT BY DETECTING GROUND FAULT CURRENT FLOWING FROM GROUND TO NEUTRAL POINT OF EXCITING CIRCUIT

BACKGROUND OF THE INVENTION

1. Field of the Invention

The present invention relates to an apparatus for detecting ground fault of an exciting circuit having an inverter that controls an excited voltage for example by controlling DC voltage with pulse width modulation control (PWM control), and of a field winding of an AC exciting variable speed rotating machine applied excited voltage from the exciting circuit; and a method thereof.

2. Description of the Related Art

Generally, one winding ground fault of a field winding of an AC exciting rotating machine can not be directly detected during the AC exciting rotating machine operation, because the field winding of the AC exciting rotating machine is applied a high voltage and is not grounded. In the past, such ground fault is detected by measuring an insulation resistance of the field winding or the like when the AC exciting rotating machine is stopped.

However, when one winding ground fault is occurred in the field winding of the AC exciting rotating machine, because the field winding of the AC exciting rotating machine is applied a high voltage and is not grounded, dielectric breakdown of the field winding is occurred. The dielectric breakdown of the field winding leads to a short-circuit fault and may result in a damage to an equipment. Consequently, it is required to detect such ground fault with certainty during the AC exciting rotating machine operation.

In particular, the AC exciting variable speed rotating machine applied the excited voltage by the exciting circuit having an inverter that controls the excited voltage by controlling DC voltage with PWM control uses a three-phase AC voltage of a PWM controlled square wave pulse as the excited voltage and has two features as follows:

(1) A frequency of a fundamental wave signal of the excited voltage is controlled in proportion to a difference (referred to as a "slip") between a rotating speed of a rotating magnetic field occurred by a field winding of a rotor and a rotating speed of the rotor and is varied from 0 Hz to 50 or 60 Hz.

(2) An excited voltage is hundreds Hz of a square wave pulse voltage that an amplitude and a frequency of a fundamental wave signal are controlled by PWM control.

Therefore, detecting such ground fault of the AC exciting variable speed rotating machine with certainty is difficult.

SUMMARY OF THE INVENTION

The present invention is made so as to solve such problem. An object of the invention is to provide a ground fault detecting apparatus for detecting a ground fault of a field circuit of an AC exciting rotating machine and an exciting circuit during the AC exciting rotating machine operation with certainty and a method thereof.

To achieve the above-mentioned object, according to the present invention, an apparatus detects a ground fault of an exciting circuit and a field circuit of an AC exciting variable speed rotating machine, wherein the exciting circuit outputs an excited voltage controlled a frequency and/or an amplitude, the field circuit of the AC exciting variable speed rotating machine is applied a field current by the excited voltage of the exciting circuit, and a ground resistance is connected between a neutral point and a ground, and wherein the apparatus detects the ground fault according to a detected current flowing from the ground to the neutral point through said ground resistance.

When a ground fault is occurred in an exciting circuit, a ground fault current flows from a ground fault point to a neutral point via a ground through a ground resistance by a voltage applied to the exciting circuit or a voltage applied by an excited voltage. The ground fault is determined by detecting the current flowing toward a neutral point.

The current flowing toward a neutral point is detected as a voltage signal using for example a Hall type DCCT. The ground resistance of the apparatus may be constructed of a first resistance and a second resistance connected in series. The system detects a voltage drop in either the first resistance or the second resistance, and further detects a current flowing toward a neutral point according to the detected voltage drop.

The exciting circuit may have an inverter that inputs a DC voltage based upon a neutral point or a cycloconverter having a neutral point.

BRIEF DESCRIPTION OF THE DRAWINGS

The above and other advantages of the invention will become more apparent in the following description and the accompanying drawings in which like numeral refer to like parts and in which.

DESCRIPTION OF THE PREFERRED EMBODIMENTS

Figure 1:
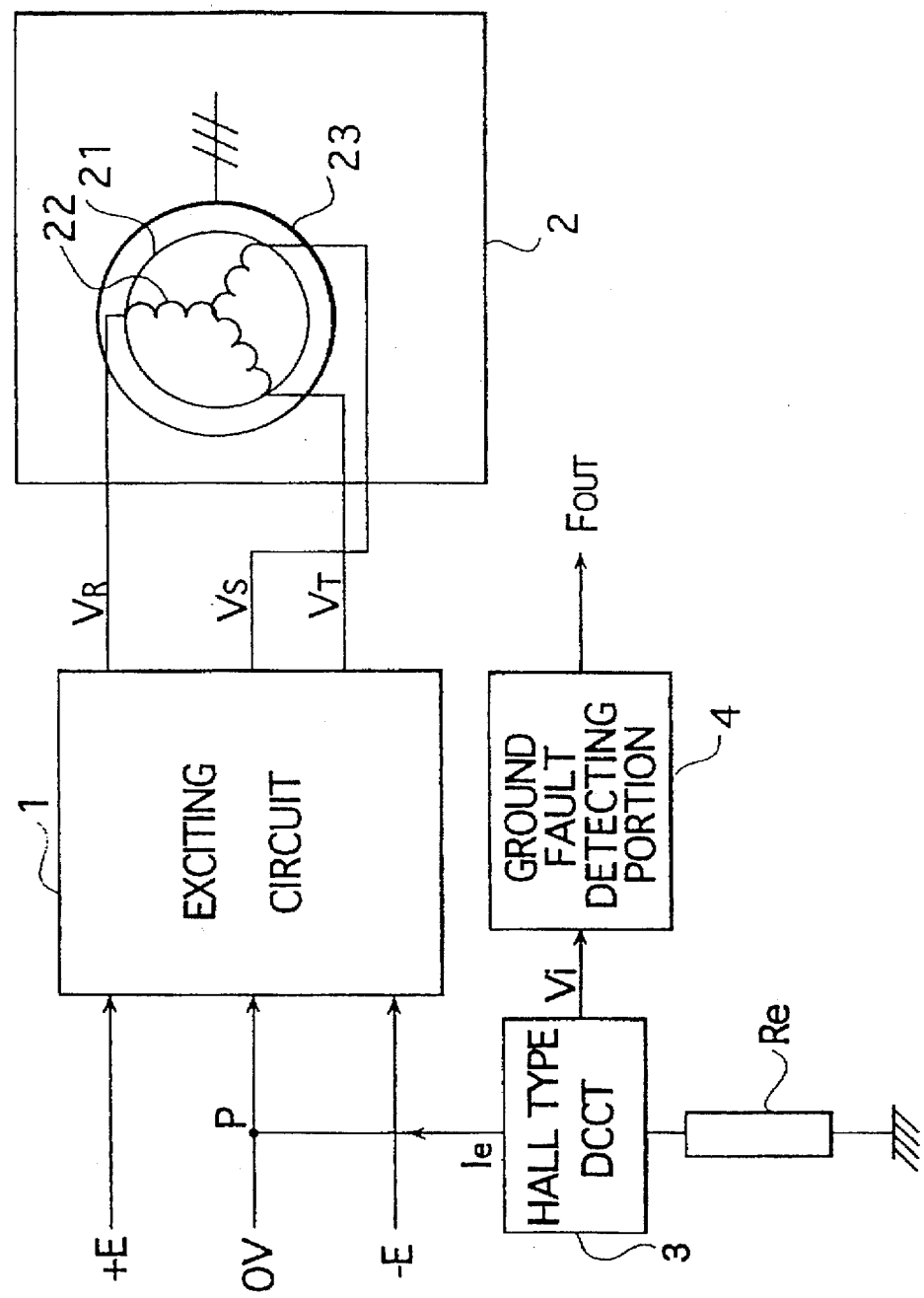
FIG. 1 is a schematic diagram showing a construction of a system according to first embodiment of the present invention.

FIG. 1 shows a construction of a system for detecting a ground fault according to first embodiment.

As shown in FIG. 1, an exciting circuit 1 receives DC voltages +E and –E based upon a neutral point P, and outputs three-phase excited voltages VR, VS and VT that are PWM controlled. In an AC excited variable speed rotating machine 2, a field winding 22 of a rotor 21 is excited and a rotating magnetic field is generated. A rotor winding 23 is formed outside of the rotor 21. The exciting circuit 1 controls a frequency of a fundamental wave and a voltage of the exciting voltages VR, VS and VT, in proportion to a difference (slip) between a rotating speed of the rotating magnetic field generated by the field winding 22 of the rotor 21 and a rotating speed of the rotor 21.

Figure 2:
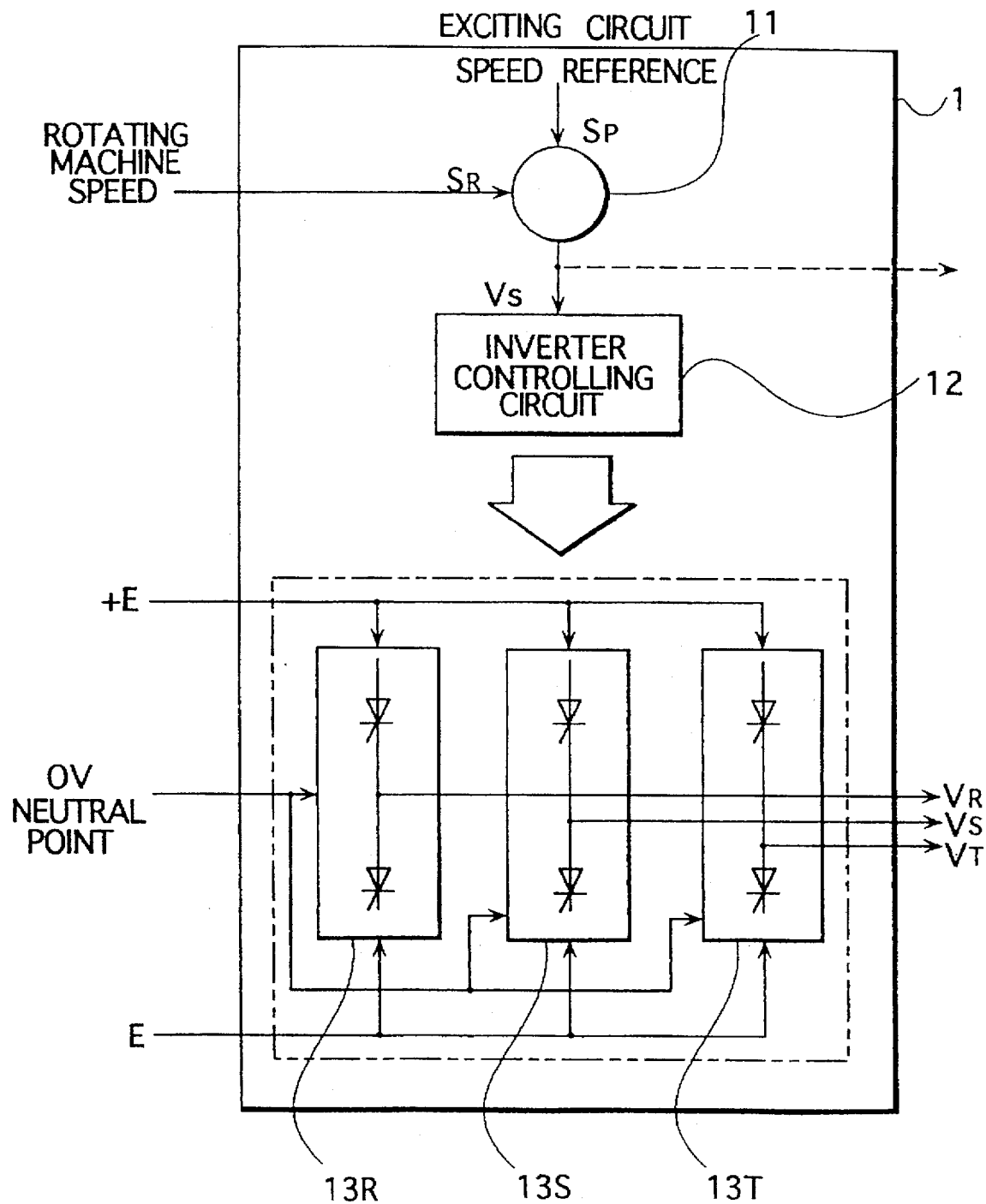
FIG. 2 is a block diagram showing a construction of an exciting circuit in FIG. 1.

FIG. 2 shows a construction of the exciting circuit 1.

Figure 3:
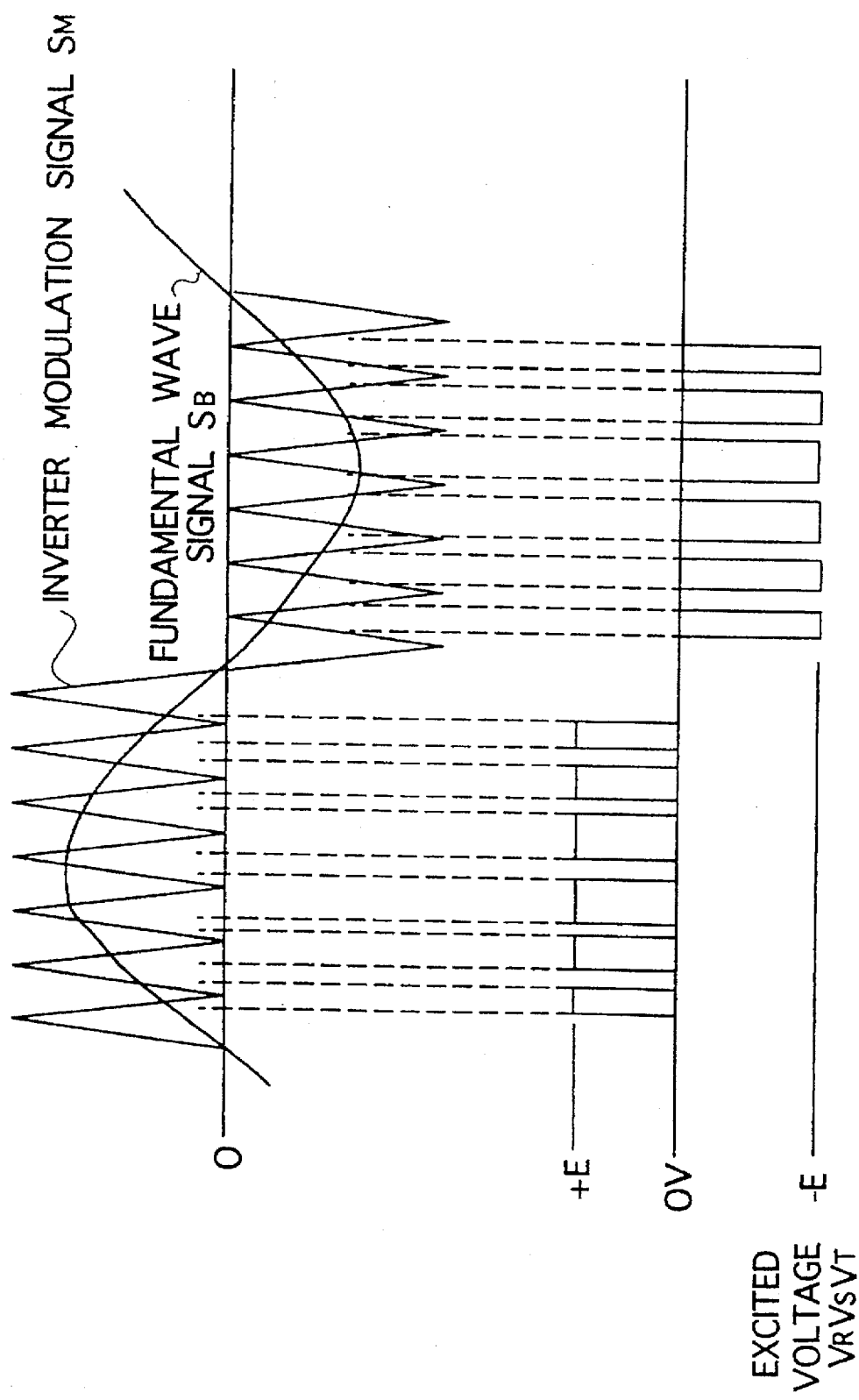
FIG. 3 is a schematic diagram showing waveforms of an excited voltage applied to an AC exciting variable speed rotating machine.

As shown in FIG. 2, a comparator 11 receives inputs of a speed reference signal SP and a rotating machine speed signal SR and outputs a fundamental wave signal Vs corresponding to a difference between these signals. The speed reference signal SP is a signal, for example a frequency signal, inputted from a system, for example a power-transmission line in a power plant. The rotating machine speed signal SR is a signal based upon a rotating speed of the rotor 21. As shown in FIG. 3, an inverter controlling circuit 12 inputs the fundamental wave signal Vs, generates a trigger signal based upon the fundamental wave signal Vs and an inverter modulation signal SM and outputs the trigger signal. Inverter circuits 13R, 13S and 13T are connected in antiparallel a gate turn-off SCR (reverse-blocking triode-thyristor) and convert DC voltages +E and –E based upon a neutral point P corresponding to the trigger signal to the excited voltages VR, VS and VT. A wave of the excited voltage in FIG. 3 shows for example one period of the excited voltage VR. The excited voltages VR, VS and VT are hundreds Hz of square wave pulse voltages that amplitudes and frequencies are controlled by the PWM control corresponding to the fundamental wave signal as shown in FIG. 3.

A ground resistance Re and a Hall type DCCT 3 as a means for detecting a current are connected in series between a neutral point of the exciting circuit 1 and a ground. A value of the ground resistance Re is set not to damage an equipment by a ground fault current that flows when a ground fault is occurred. For example, the resistance value is set so that about 100 mA of a ground fault current Ie flows through the ground resistance Re when a ground fault is occurred on an output side of the exciting circuit 1. The Hall type DCCT 3 outputs a secondary output voltage Vi in proportion to the ground fault current Ie.

A ground fault detecting portion 4 inputs the secondary output voltage Vi from the Hall type DCCT 3 and detects a ground fault of the exciting circuit 1 based upon the inputted secondary output voltage Vi. When detecting a ground fault, the ground fault detecting portion 4 outputs a ground fault detected signal FOUT.

Figure 4:
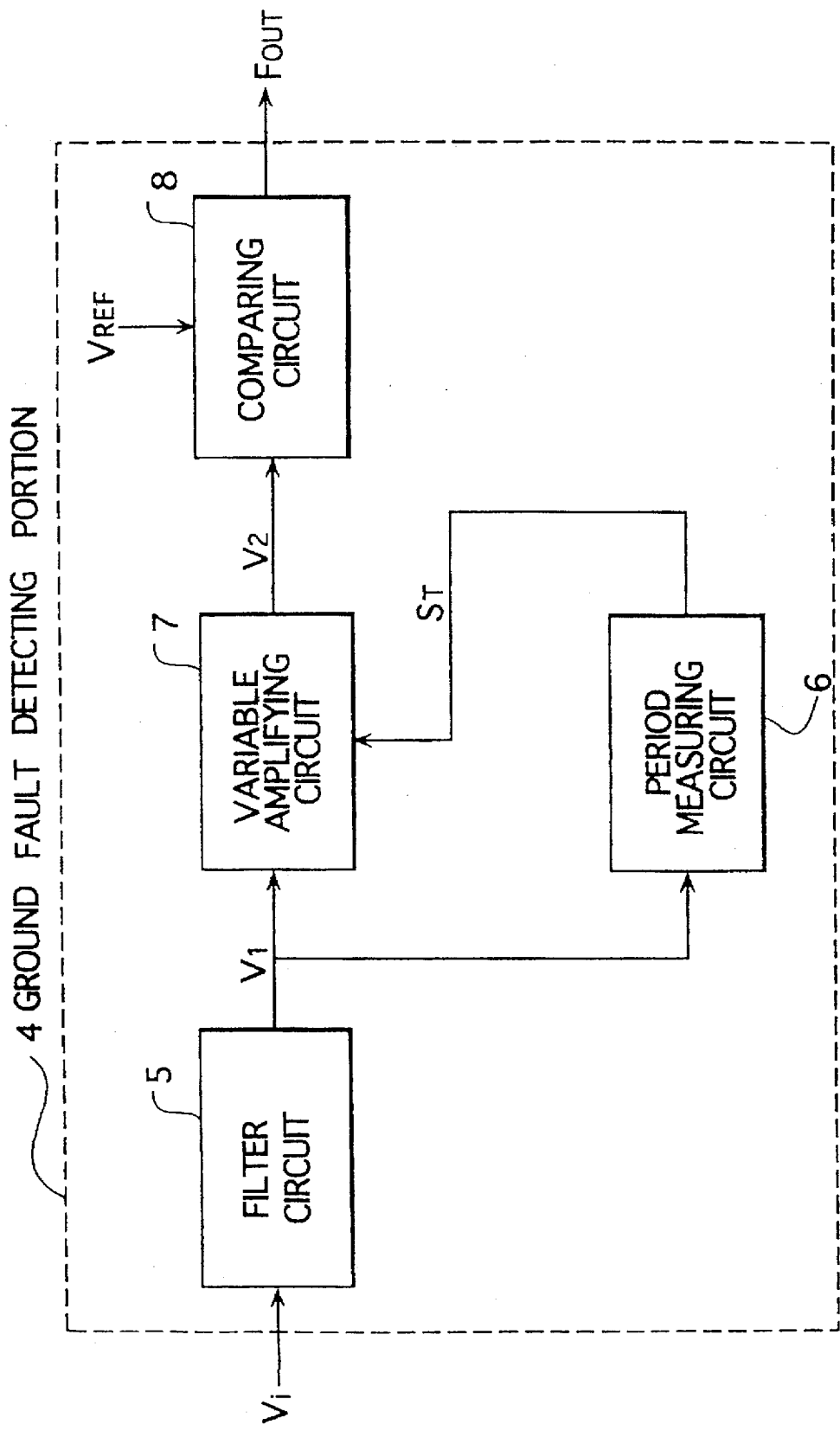
FIG. 4 is a block diagram showing a construction of a ground fault detecting portion in FIG. 1.

FIG. 4 is a block diagram showing a construction of the ground fault detecting portion 4 in FIG. 1.

As shown in FIG. 4, a filter circuit 5 extracts a component of the fundamental wave signal Vs (a fundamental wave signal V1) that eliminates high-frequency components of the inverter modulation control in the exciting circuit 1 from the inputted secondary output voltage Vi. The filter circuit 5 is constructed for example of a low-pass filter.

A period measuring circuit 6 receives the fundamental wave signal V1, measures a period T of the fundamental wave signal V1, and outputs a period signal ST corresponding to the measured period T.

A variable amplifying circuit 7 inputs the fundamental wave signal V1 and the period signal ST and amplifies an amplitude of the fundamental wave signal V1 corresponding to the period signal ST.

A comparing circuit 8 inputs a detected signal V2 that is an output of the variable amplifying circuit 7, compares the output V2 with predetermined reference value VREF, and outputs a ground fault detected signal FOUT when a detected signal V2 exceeds the predetermined reference value VREF. The reference value VREF is set corresponding to for example a ground fault current having normal floating capacity.

Such system constructed as above-mentioned detects a ground fault as follows.

When a ground fault is occurred on an input side (DC voltage +E or –E) of the exciting circuit 1, a ground fault current Ie having a current value given by the DC voltage +E or –E divided by the resistance value of the ground resistance Re flows from the ground to a neutral point P through the ground resistance Re and the Hall type DCCT 3.

When a ground fault occurs on an output side (excited voltages VR, VS and VT) of the exciting circuit 1, a ground fault current Ie having a current value given by the square wave pulse of AC voltage VR, VS and VT divided by the resistance value of the ground resistance Re flows from the ground fault point to a neutral point P via a ground through the ground resistance Re and the Hall type DCCT 3.

Thus, flowing the current into the Hall type DCCT 3, the secondary output voltage Vi having a voltage value in proportion to the current value of the ground fault current Ie is outputted from the Hall type DCCT 3, and is inputted to the ground fault detecting portion 4.

In the ground fault detecting portion 4, the secondary output voltage Vi is inputted to the period measuring circuit 6 and the variable amplifying circuit 7 through the filter circuit 5 as the fundamental wave signal V1. In the variable amplifying circuit 7, the fundamental wave signal V1 and the period signal ST outputted from the period measuring circuit 6 are inputted, and the detected signal V2 that proportions the amplitude of the fundamental wave signal V1 to the period of the fundamental wave signal 1 by the period signal ST is outputted. In the comparing circuit 8, the detected signal V2 and the reference value VREF are inputted. When the detected signal V2 exceeds the reference value VREF, the ground fault detected signal FOUT is outputted.

In this embodiment, the resistance value of the ground resistance Re is set not to damage an equipment by a ground fault current that flows when a ground fault is occurred. For example, the resistance value is set so that about 100 mA of a ground fault current Ie flows through the ground resistance Re when a ground fault is occurred on an output side of the exciting circuit 1. Thereby, the ground fault can be detected during the operation of the AC exciting variable speed rotating machine 2.

In addition, using the Hall type DCCT as a current detecting means for detecting the ground fault current Ie, the ground fault current (input side and output side of the exciting circuit 1) that cannot be detected by a general current transformer because for example a current value is different depending on the ground fault point, and the ground fault current of an AC pulse voltage can be detected precisely and insulated.

Moreover, in the ground fault detecting portion 4, the fundamental wave signal V1 is detected by eliminating high-frequency components from the secondary output voltage Vi by the filter circuit 5, thereby effect of a leak current of the high-frequency components by the floating capacity is reduced and the ground fault can be detected accurately.

Furthermore, varying the amplitude of the fundamental wave signal V1 that proportions to a frequency in proportion to a period of the fundamental wave signal V1, the ground fault caused by the excited voltage of the rotating machine that the amplitude is varied in proportion to the frequency of the fundamental wave signal Vs can be detected with constant detecting sensitivity as follows:

$$V1 = K \times f$$

$$V2 = T \times V1 = (1/f) \times (K \times f) = K \text{ (constant)}$$

where K is a coefficient, f is a frequency of the fundamental wave signal V1 and T is a period of the fundamental wave signal V1, respectively.

Figure 5:
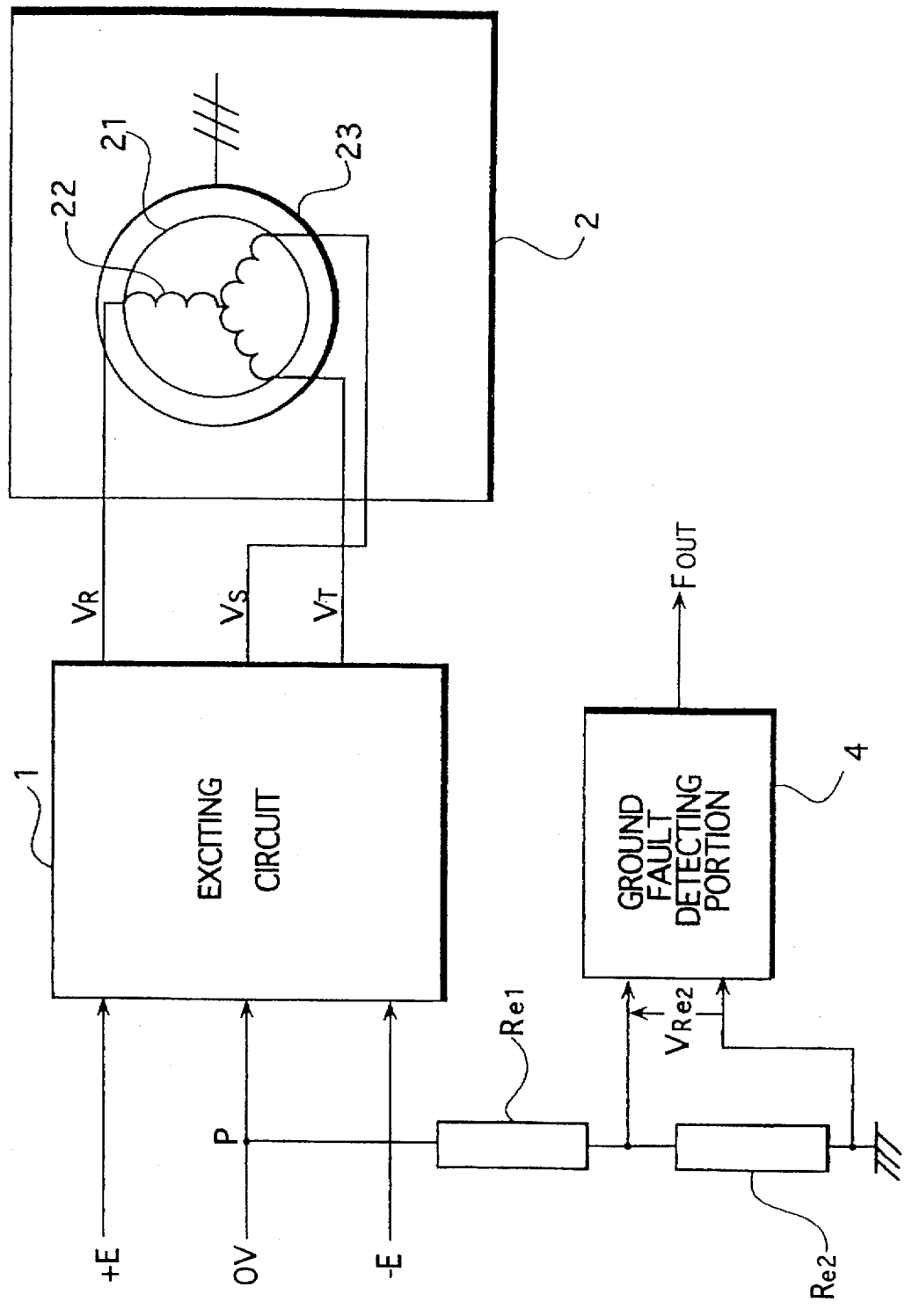
FIG. 5 is a schematic diagram showing a construction of a system according to second embodiment of the present invention.

FIG. 5 shows a construction of a system for detecting a ground fault according to second embodiment.

In FIG. 1, the ground resistance Re and the Hall type DCCT3 are connected in series between a neutral point of the exciting circuit 1 and a ground. In contrast, in the system as shown in FIG. 5, a resistance Re1 and a resistance Re2 are connected in series between a neutral point of the exciting circuit 1 and a ground. The system detects a voltage drop across both ends of the resistance Re2 in proportion to the ground fault current Ie, thereby detects a ground fault current Ie.

The voltage drop Ve of the resistances Re1 and Re2 occurred by the ground fault current is divided a voltage by the resistance Re1 and Re2 and is represented by an equation as follows:

$$VRe2 = Re2/(Re1+Re2) \times Ve$$

Consequently, by predetermining any resistance value ratio of the resistances Re1 and Re2, the ground fault current that the value varies depending upon the ground fault point and the ground fault current of the AC pulse voltage can be detected as any voltage VRe2 in proportion to the ground fault current.

Figure 6:
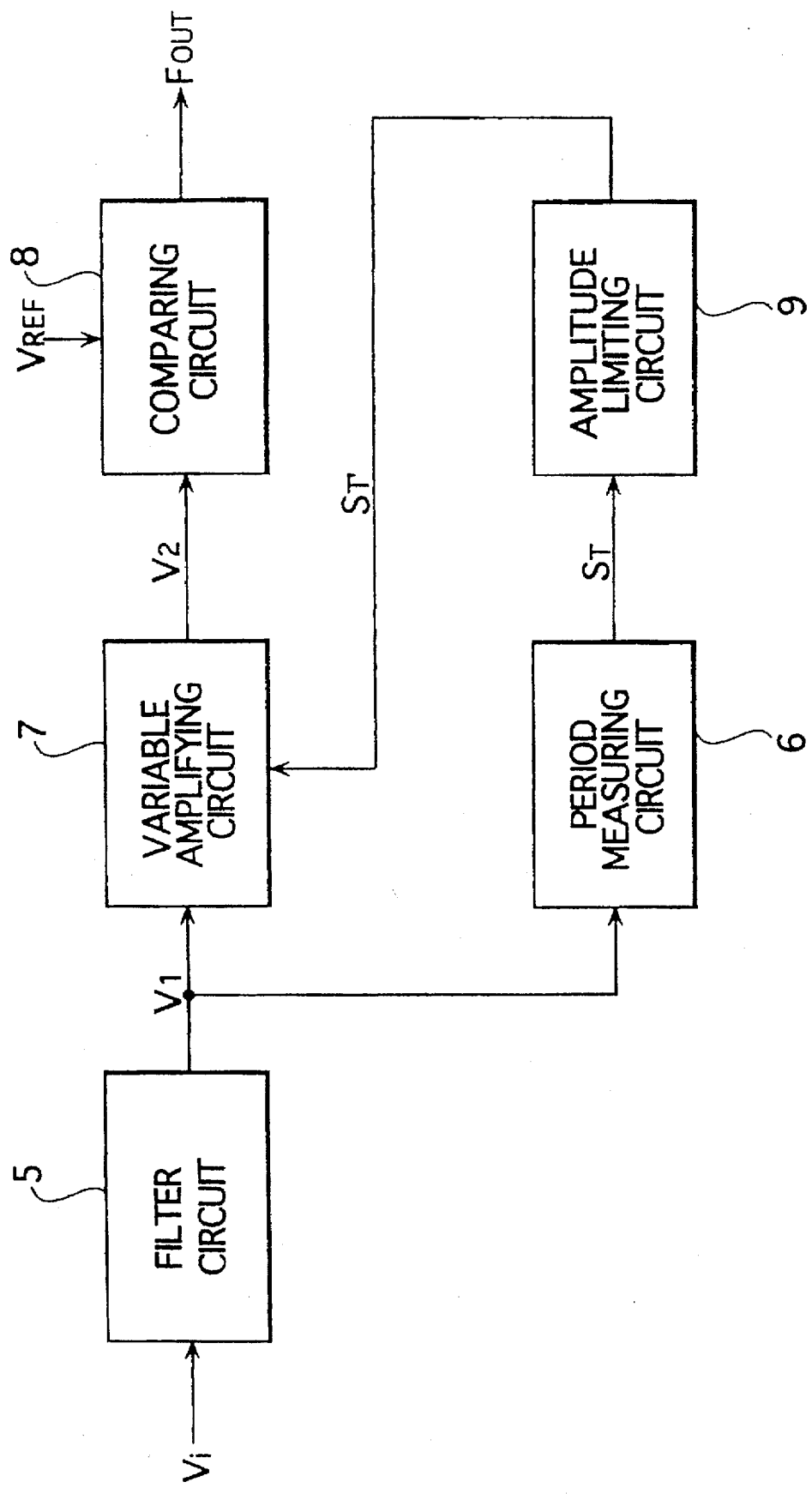
FIG. 6 is a block diagram showing a transformed example of the ground fault detecting portion in FIG. 1.

FIG. 6 is a block diagram showing a transformed example of the ground fault detecting portion in FIG. 4.

As shown in FIG. 6, an amplitude limiting circuit 9 is formed between the period measuring circuit 6 and the variable amplifying circuit 7 in the ground fault detecting portion.

Figure 7:
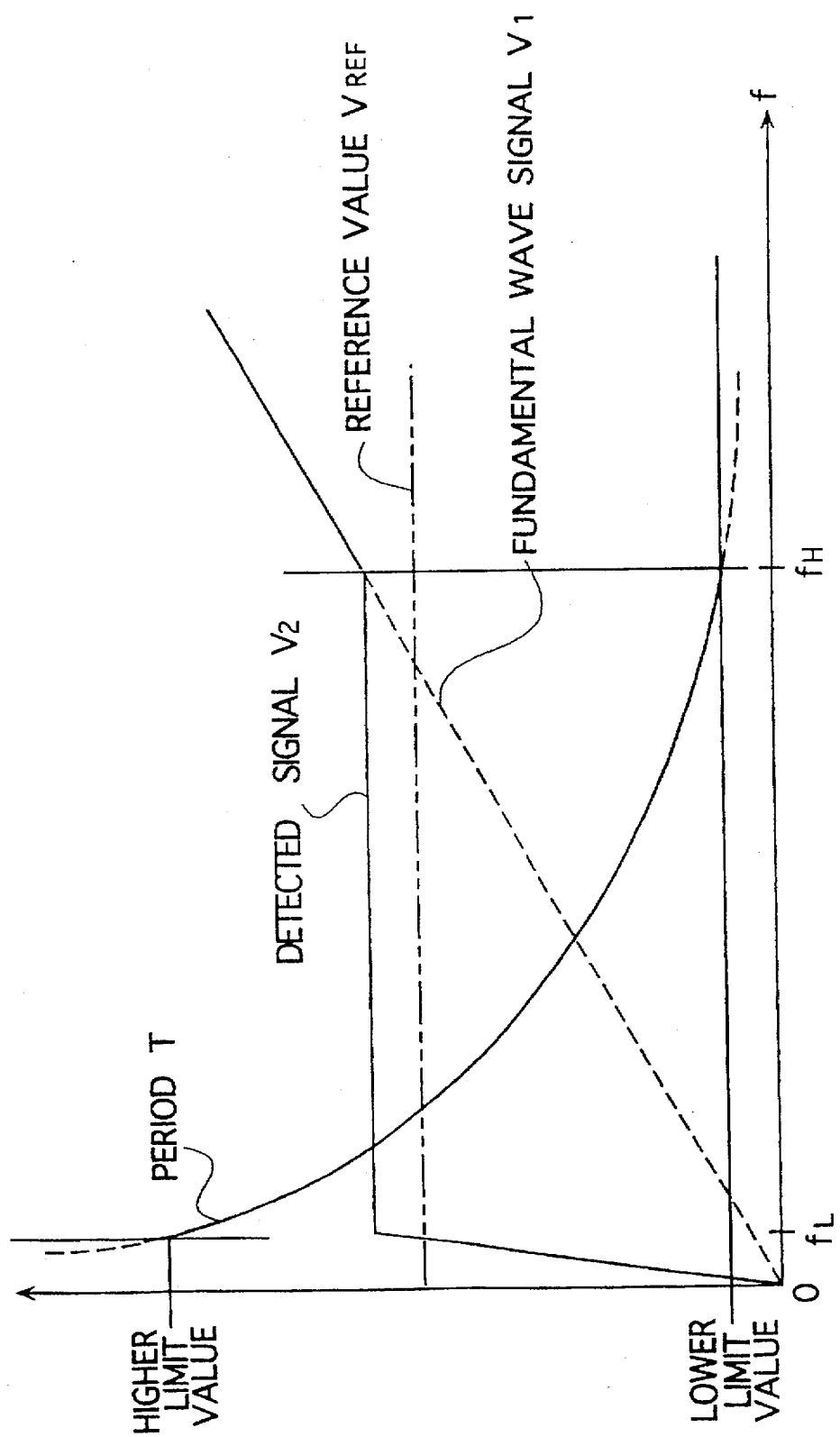
FIG. 7 is a graphical representation for explaining a feature of the ground fault detecting portion in FIG. 6.

As shown in FIG. 7, the amplitude limiting circuit 9 inputs the period signal ST from the period measuring circuit 6, and when the period T of the inputted period signal ST exceeds predetermined higher limit value (1/fL), then the circuit 9 limits the period T of the inputted period signal ST to the higher limit value, that is a fixed value. And when the period T of the inputted period signal ST is under predetermined lower limit value (1/fH), then the circuit 9 limits the period T of the inputted period signal ST to the lower limit value, that is a fixed value. The limited period signal ST" is outputted to the variable amplifying circuit 7.

The variable amplifying circuit 7 limits the amplitude of the fundamental wave signal V1 by the period signal ST', thereby an amplified gain of the variable amplifying circuit 7 becomes a fixed gain in a frequency area that exceeds the higher limit value and is under the lower limit value of the period signal ST'. The detected signal V2 attenuates under a frequency fL that is the higher limit value of the period T, and grows more than a frequency fH that is the lower limit value of the period T.

Comparing the detected signal V2 having such limitation to the reference value VREF by the comparing circuit 8, the ground fault is hard to detect under a frequency fL that the period T is the higher limit value, and is easy to detect more than a frequency fH that the period T is the lower limit value.

Consequently, in an amplifying control that varies the amplitude of the fundamental wave signal in proportion to the period, the higher and lower limits of the amplitude are set, thereby the ground fault can be detected with constant detecting sensitivity in the frequency range from the higher limit value to the lower limit value. In addition, the ground fault can be detected lowering the detecting sensitivity in a low-frequency area that exceeds the higher limit value, and heightening the detecting sensitivity in a high-frequency area that is under the lower limit value.

In other words, by the higher and lower limits of the amplitude control to be minimum and maximum fundamental frequencies in a normal operating area of the AC exciting variable speed rotating machine, the amplitude is controlled with the fixed gain in the low-frequency area that exceeds the higher limit value of the amplitude control in the normal operating range. Thereby, detecting the ground fault improperly by amplifying a noise of floating capacity or the like is prevented. In addition, in starting up the AC exciting variable speed rotating machine, when the amplitude is controlled with the fixed gain in the high-frequency area that is under the lower limit value of the amplitude control, the detected signal grows corresponding to the fundamental wave signal as well, thus, the ground fault can be easily detected.

Figure 8:
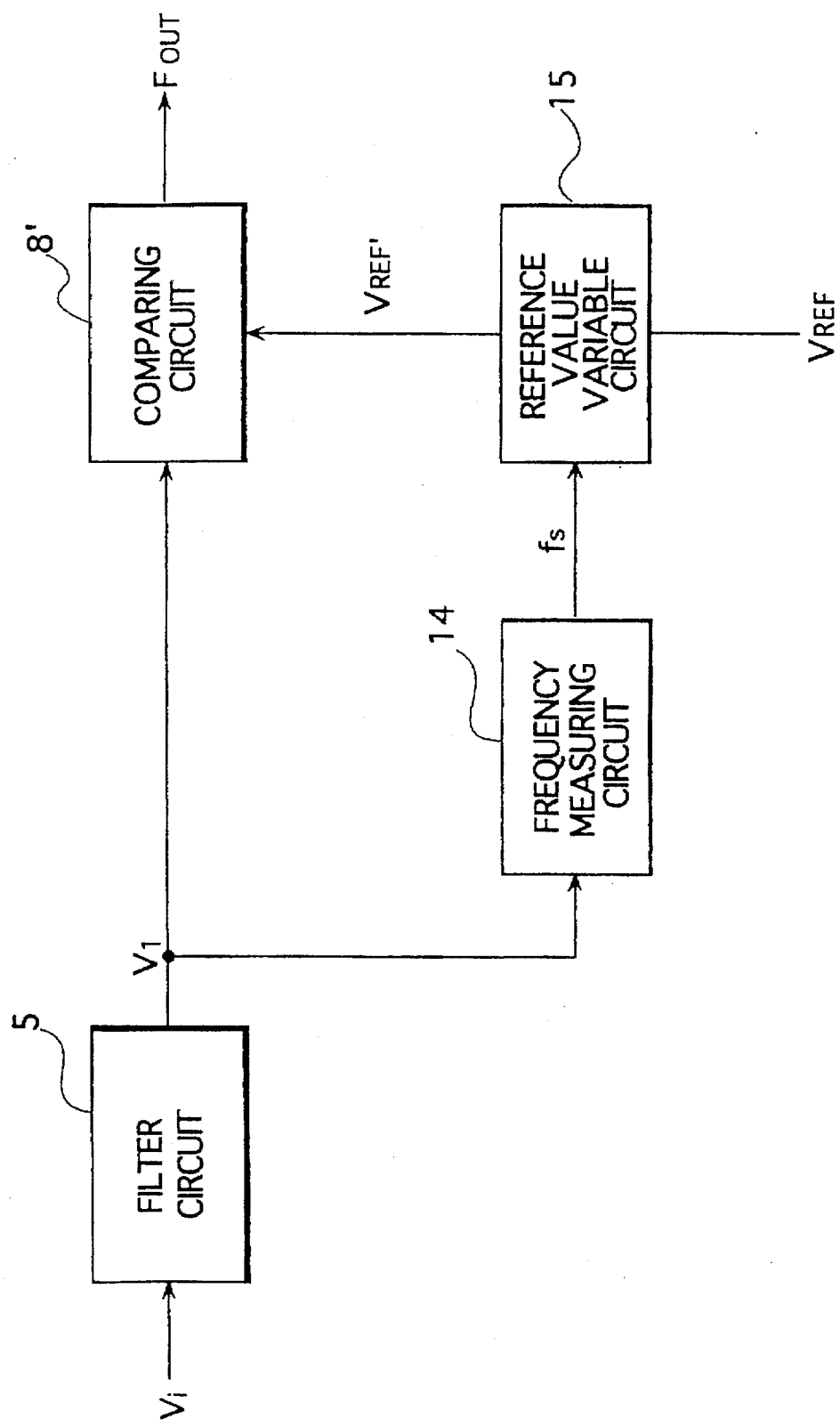
FIG. 8 is a block diagram showing a transformed example of the ground fault detecting portion in FIG. 4.

FIG. 8 shows another transformed example of the ground fault detecting portion in FIG. 4.

In the ground fault detecting portion as shown in FIG. 8, a frequency measuring circuit 14 for measuring a frequency f of the fundamental wave signal V1 is formed instead of the period measuring circuit 6 as shown in FIG. 4, and a reference value variable circuit 15 for varying the reference value VREF into a frequency of the fundamental wave signal V1 in proportion thereto by a frequency signal fs of the frequency measuring circuit 14, and for outputting a variable reference signal VREF' is formed instead of the variable amplifying circuit 7 as shown in FIG. 4. In addition, a comparing circuit 8' is formed to determine whether the ground fault is present or not, comparing the fundamental wave signal V1 with the variable reference signal VREF'.

In the comparing circuit 8', a ratio represented by following equations of the fundamental wave signal V1 and the variable reference signal VREF' that is varied the reference value VREF into the frequency f of the fundamental wave signal V1 in proportion thereto is the same as the ratio of the fundamental wave signal V1 in proportion to the period T and the detected signal V2 being the reference value VREF constant as shown in FIG. 4. Thereby, the ground fault detecting portion shown in FIG. 8 has same effect as the one shown in FIG. 4.

$$V2:VREF=T\times V1:VREF$$

$$V1\times VREF'=V1:f\times VREF$$

where f=1/T, V1=K×f, and K represents a coefficient, $$V1/VREF'=V2/VREF=(T\times V1)/VREF=K/VREF$$

Figure 9:
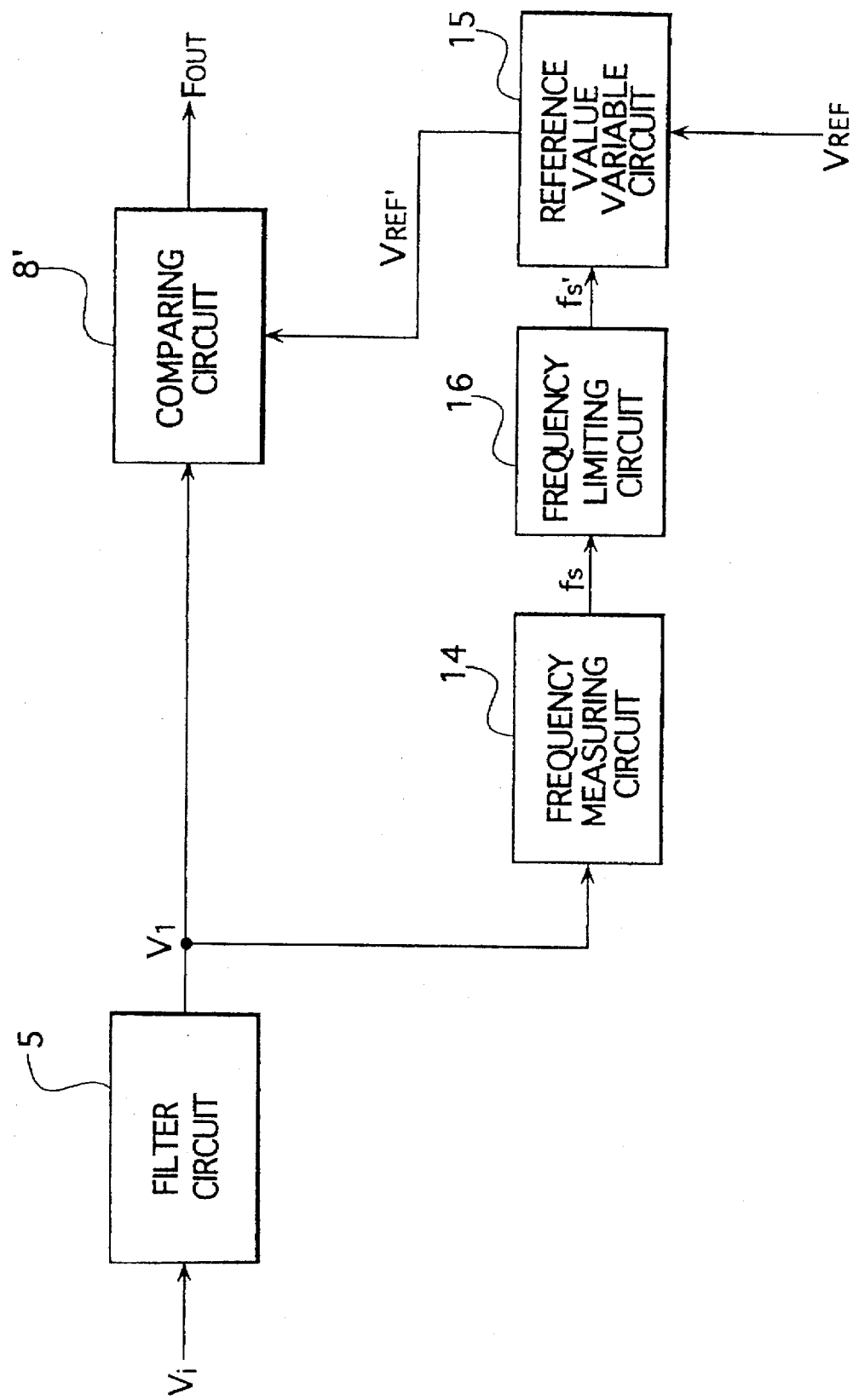
FIG. 9 is a block diagram showing a transformed example of the ground fault detecting portion in FIG. 8.

FIG. 9 shows another transformed example of the ground fault detecting portion.

Figure 10:
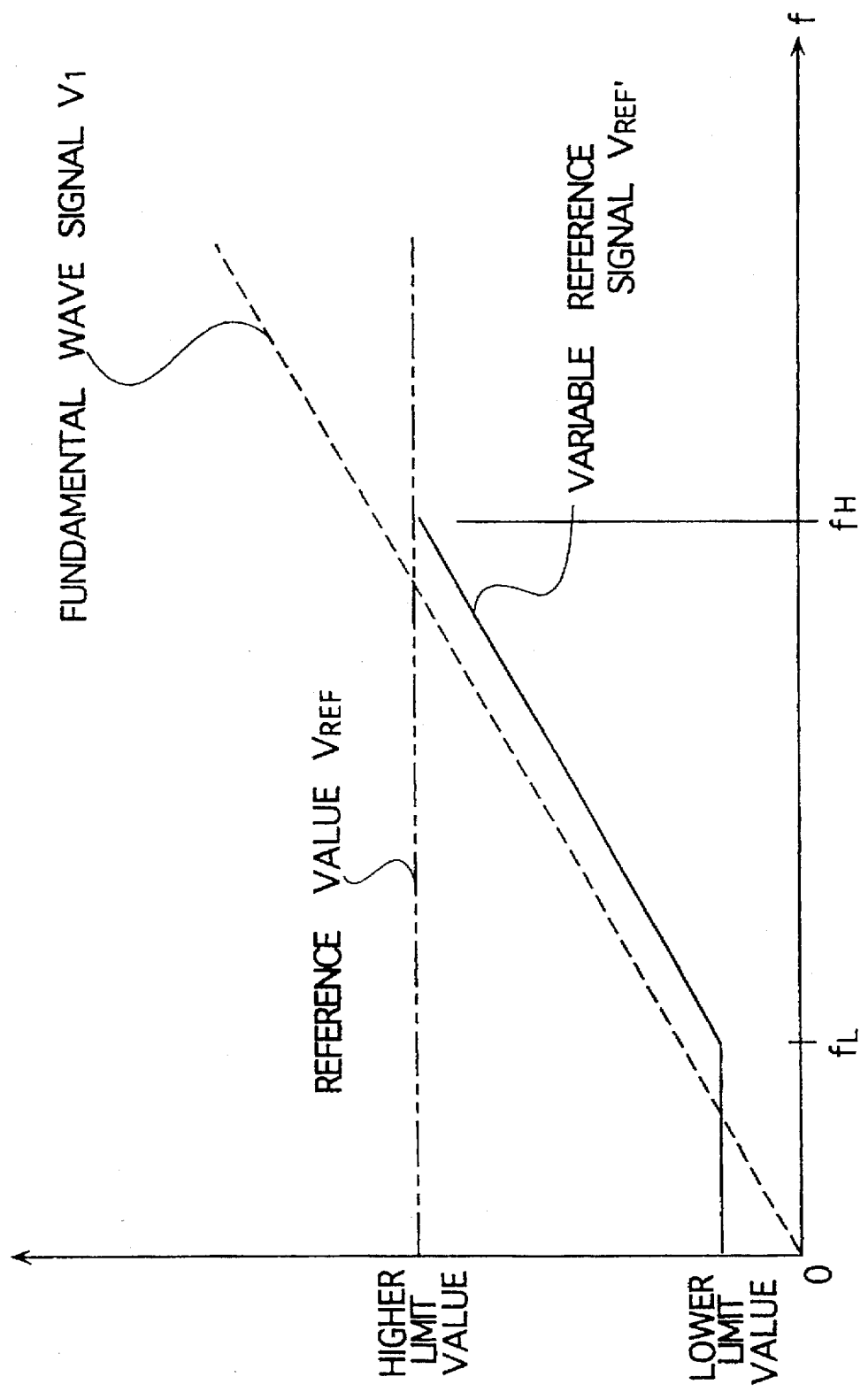
FIG. 10 is a graphical representation for explaining a feature of the ground fault detecting portion in FIG. 9.

In the ground fault detecting portion as shown in FIG. 9, a frequency limiting circuit 16 is formed between the frequency measuring circuit 14 and the reference value variable circuit 15 of the ground fault detecting portion in FIG. 8. As shown in FIG. 10, the frequency limiting circuit 16 inputs the frequency signal fs from the frequency measuring circuit 14, and when the frequency f of the inputted frequency signal fs exceeds predetermined higher limit value fH, then the circuit 16 limits the frequency f of the inputted frequency signal fs to the higher limit value, that is a fixed value. And when the frequency f of the inputted frequency signal fs is under predetermined lower limit value fL, then the circuit 16 limits the frequency f of the inputted frequency signal fs to the lower limit value, that is a fixed value. The limited frequency signal fs' is outputted to the reference value variable circuit 15.

As shown in FIG. 10, a ratio of the fundamental wave signal V1 and the variable reference signal VREF' that varies in range from the higher limit to the lower limit is same as the ratio of the detected signal V2 that varies in range from the higher limit to the lower limit and the reference value VREF as shown in FIG. 6. Thereby, the ground fault detecting portion shown in FIG. 9 has same effect as the one shown in FIG. 6.

Figure 11:
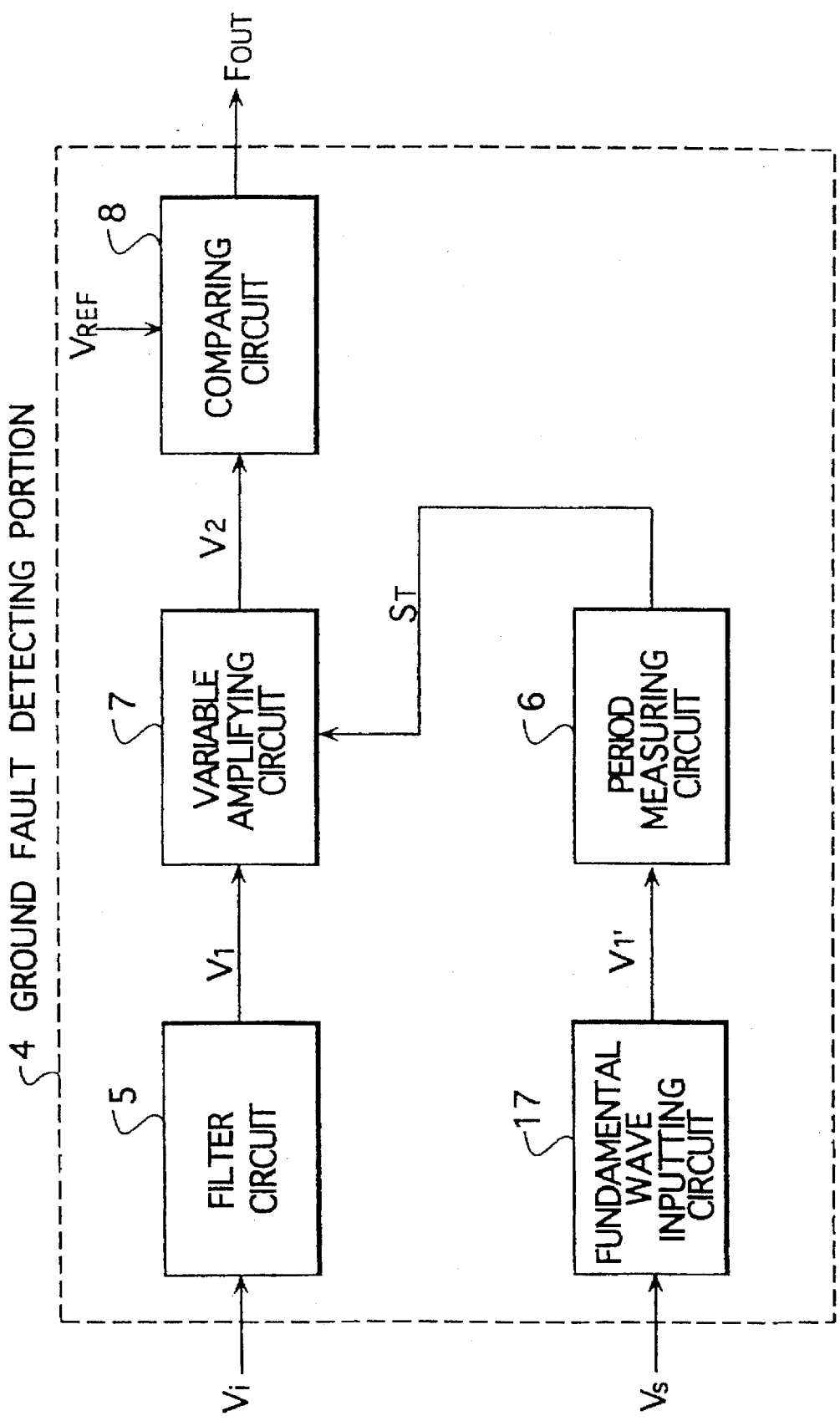
FIG. 11 is a block diagram showing another transformed example of the ground fault detecting portion.

FIG. 11 shows further transformed example of the ground fault detecting portion.

In the ground fault detecting portion as shown in FIG. 4, the fundamental wave signal V1 that is an output of the filter circuit 5 becomes an input of the period measuring circuit 6. However, in the ground fault detecting portion as shown in FIG. 11, an output of a fundamental wave inputting circuit 17 becomes the input of the period measuring circuit 6. The fundamental wave inputting circuit 17 inputs the fundamental wave signal Vs of the comparator 11 in the exciting circuit 1 shown in FIG. 2, and provides the signal to the period measuring circuit 6 as a fundamental wave signal V1'.

The fundamental wave signal Vs of the comparator 11 in the exciting circuit 1 has a constant amplitude regardless of a frequency of the fundamental wave. Therefore, the period measuring circuit 6 is tolerant of a noise and corrects continuously the period signal ST. Thereby, the ground fault can be detected promptly.

Figure 12:
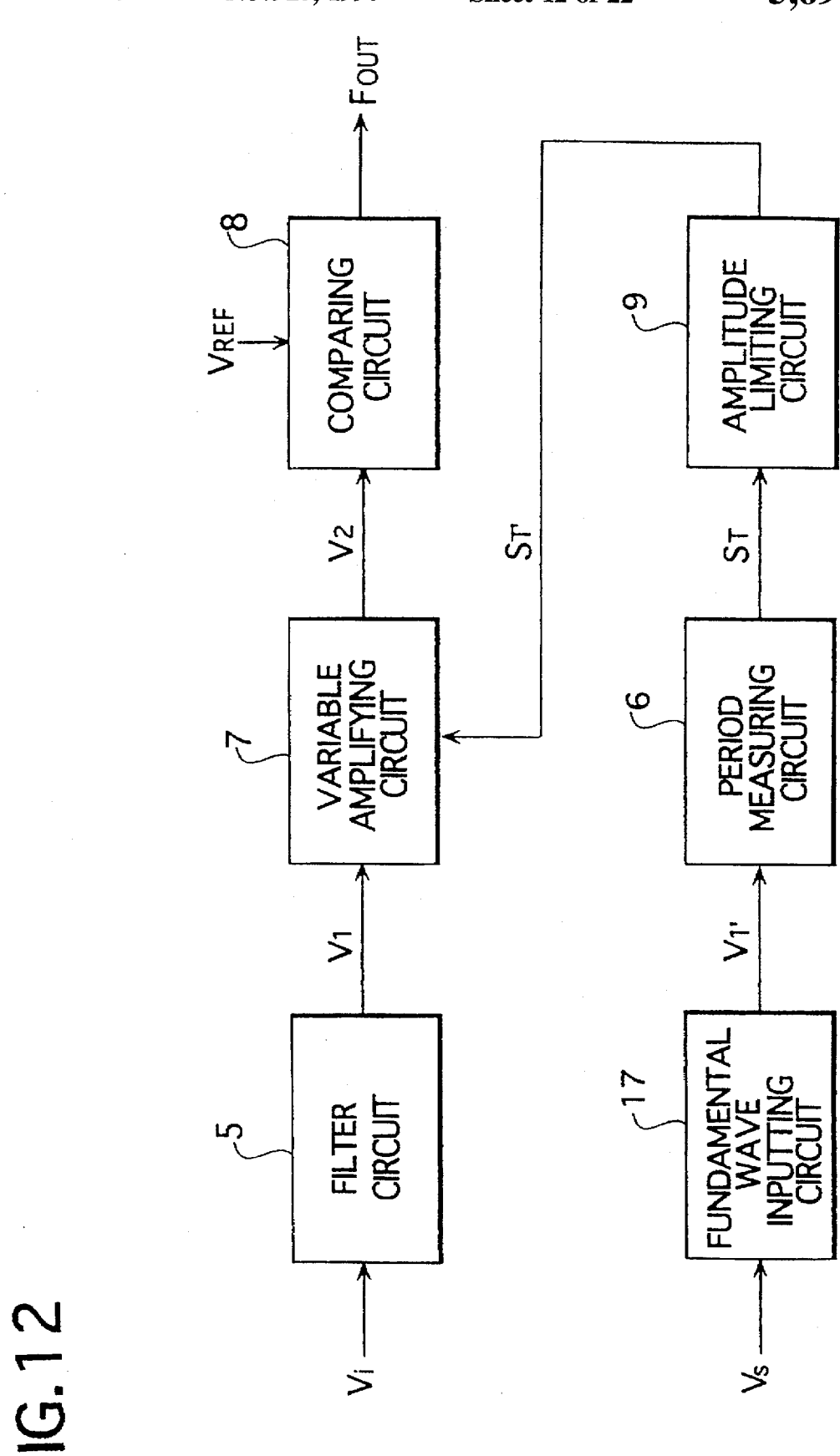
FIG. 12 is a block diagram showing another transformed example of the ground fault detecting portion.

FIG. 12 shows further transformed example of the ground fault detecting portion.

In the ground fault detecting portion as shown in FIG. 6, the fundamental wave signal V1 that is an output of the filter circuit 5 becomes an input of the period measuring circuit 6. In contrast, in the ground fault detecting portion as shown in FIG. 12, the output V1' of the fundamental wave inputting circuit 17 becomes the input of the period measuring circuit 6 as same as the one shown in FIG. 11. An action and effect of the fundamental wave inputting circuit 17 is the same as shown in FIG. 11.

Figure 13:
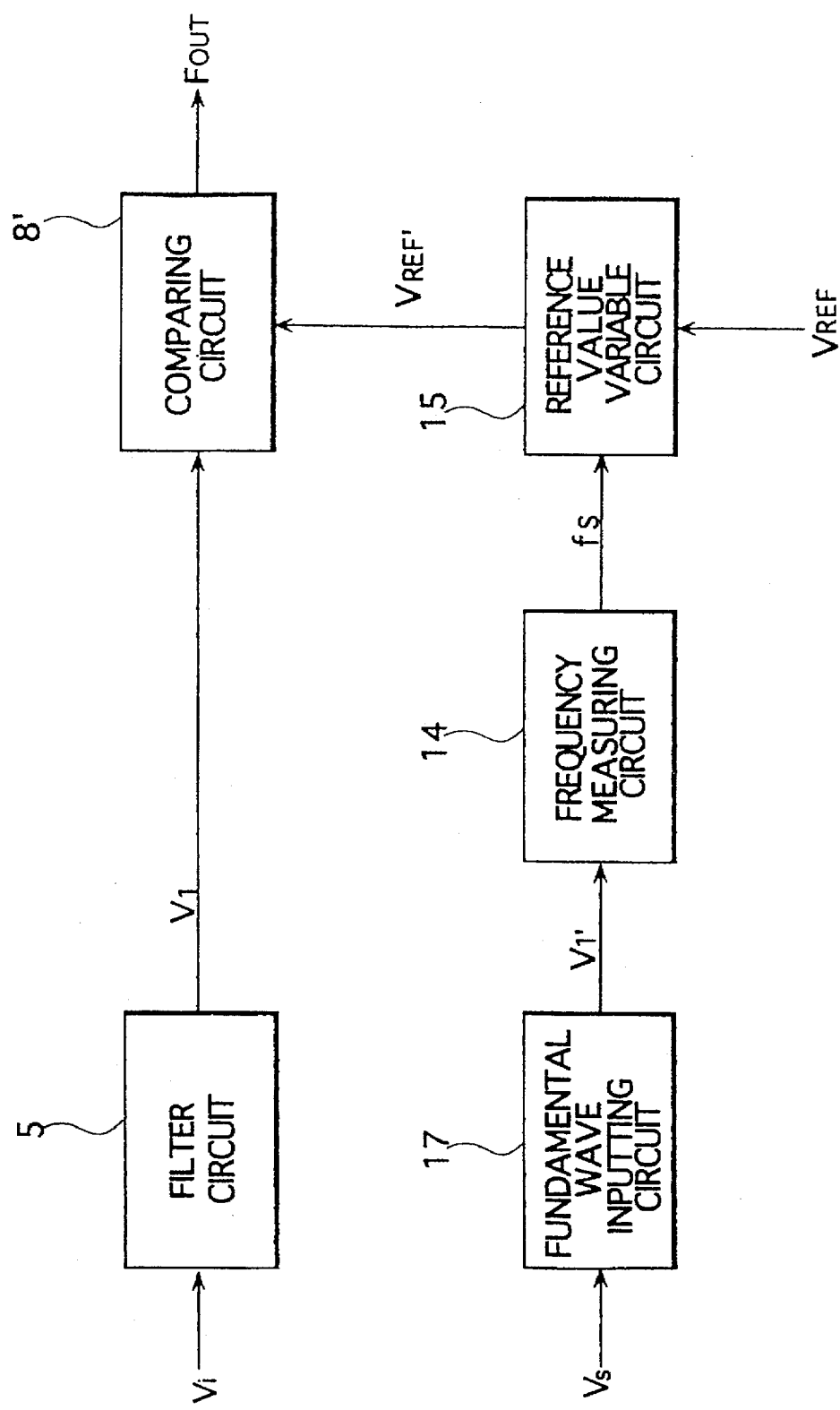
FIG. 13 is a block diagram showing another transformed example of the ground fault detecting portion.

FIG. 13 shows further transformed example of the ground fault detecting portion.

In the ground fault detecting portion as shown in FIG. 8, the fundamental wave signal V1 that is an output of the filter circuit 5 becomes an input of the frequency measuring circuit 14, and an output of the frequency measuring circuit 14 inputs to the reference value variable circuit 15. In contrast, in the ground fault detecting portion as shown in FIG. 13, the output V1' of the fundamental wave inputting circuit 17 becomes the input of the frequency measuring circuit 14 as same as the one shown in FIG. 11. An action and effect of the fundamental wave inputting circuit 17 is the same as shown in FIG. 11.

Figure 14:
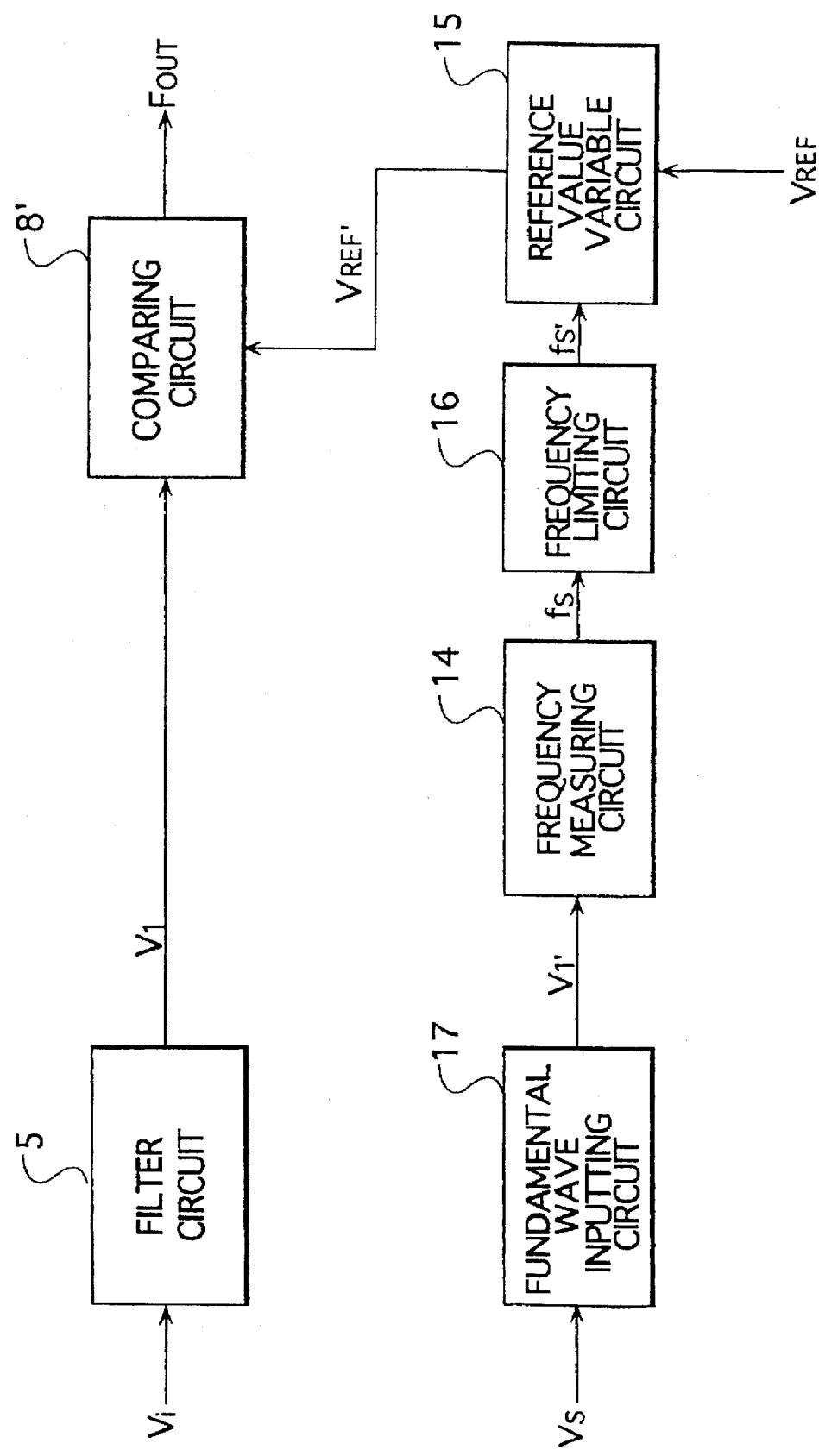
FIG. 14 is a block diagram showing another transformed example of the ground fault detecting portion.

FIG. 14 shows further transformed example of the ground fault detecting portion.

In the ground fault detecting portion as shown in FIG. 9, the fundamental wave signal V1 that is an output of the filter circuit 5 becomes an input of the frequency measuring circuit 14, and an output of the frequency measuring circuit 6 inputs to the reference value variable circuit 15 through the frequency limiting circuit 16. In contrast, in the ground fault detecting portion as shown in FIG. 14, the output V1' of the fundamental wave inputting circuit 17 becomes the input of the frequency measuring circuit 14 as same as the one shown in FIG. 11. An action and effect of the fundamental wave inputting circuit 17 is the same as shown in FIG. 11.

Figure 15:
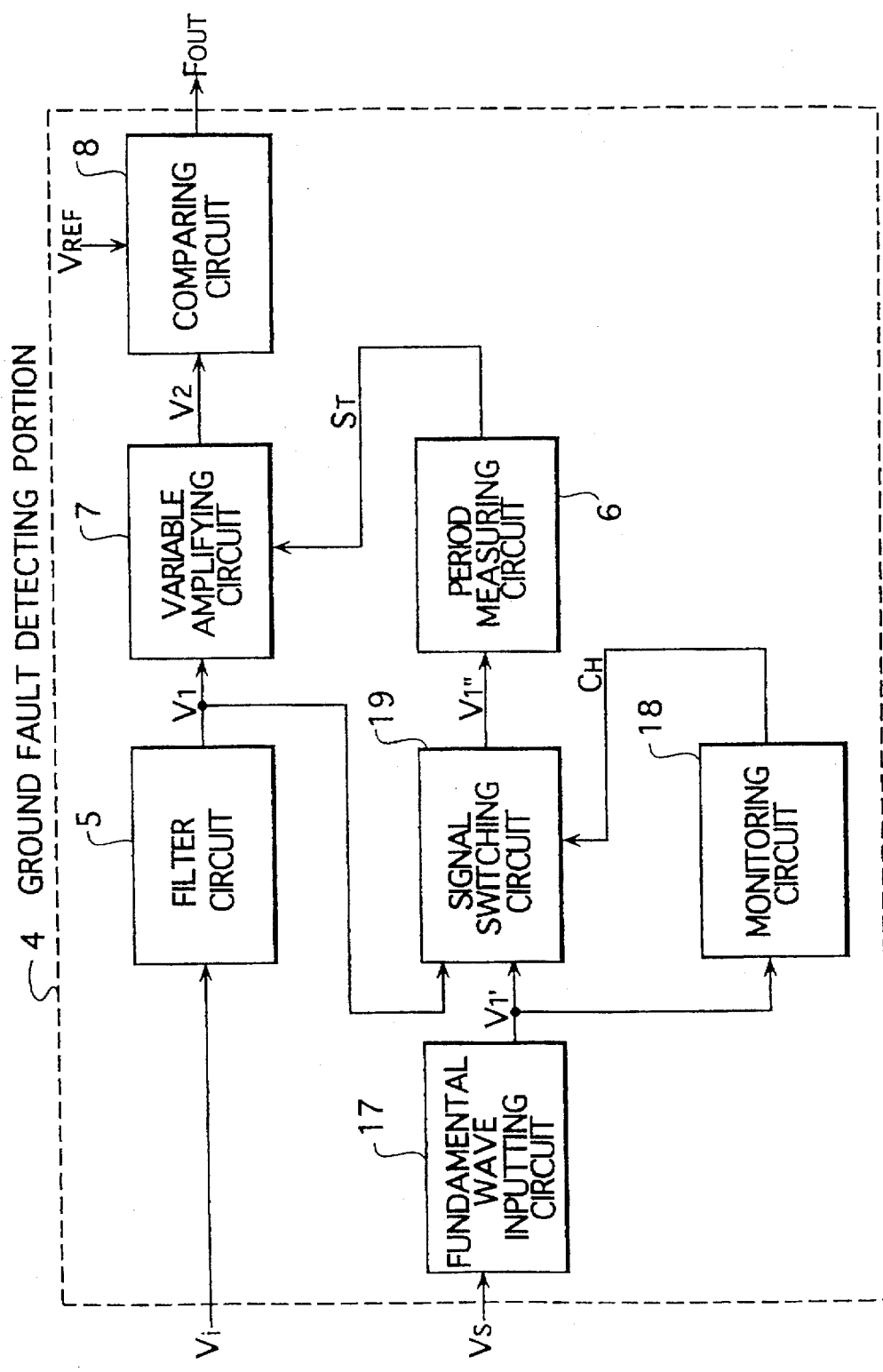
FIG. 15 is a block diagram showing another transformed example of the ground fault detecting portion.

FIG. 15 shows further transformed example of the ground fault detecting portion.

In the ground fault detecting portion as shown in FIG. 11, an output of the fundamental wave inputting circuit 17 becomes an input of the period measuring circuit 6. In contrast, in the ground fault detecting portion as shown in FIG. 15, a monitoring circuit 18 that monitors the output V1' of the fundamental wave inputting circuit 17 and a signal switching circuit 19 that a signal V1" of either the output V1 of the filter circuit 5 or the output V1' of the fundamental wave inputting circuit 17 becomes an input of the period measuring circuit 6 are formed. Normally, the output V1' of the fundamental wave inputting circuit 17 becomes an input of the period measuring circuit 6. When the output V1' is not inputted for a predetermined time period, the output V1 of the filter circuit 5 becomes an input of the period measuring circuit 6. Thereby, it takes effect that the system is operative by the fundamental wave signal V1, even when the fundamental wave signal Vs is not inputted by for example a disconnection.

Figure 16:
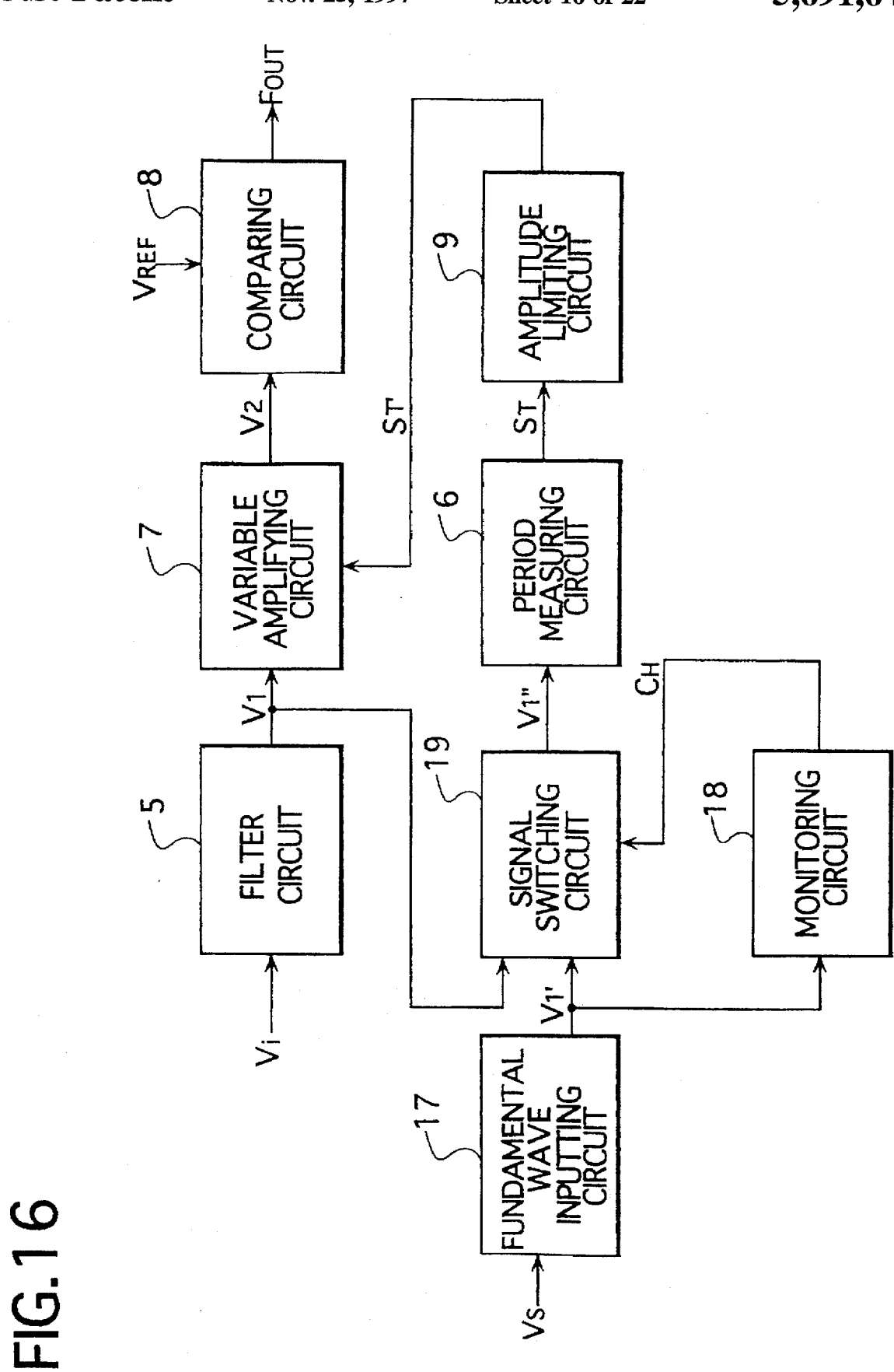
FIG. 16 is a block diagram showing another transformed example of the ground fault detecting portion.

In the ground fault detecting portion as shown in FIG. 16, the monitoring circuit 18 and the signal switching circuit 19 shown in FIG. 15 are formed in the ground fault detecting portion shown in FIG. 12, and takes same action and effect as the ground fault detecting portion shown in FIG. 15.

Figure 17:
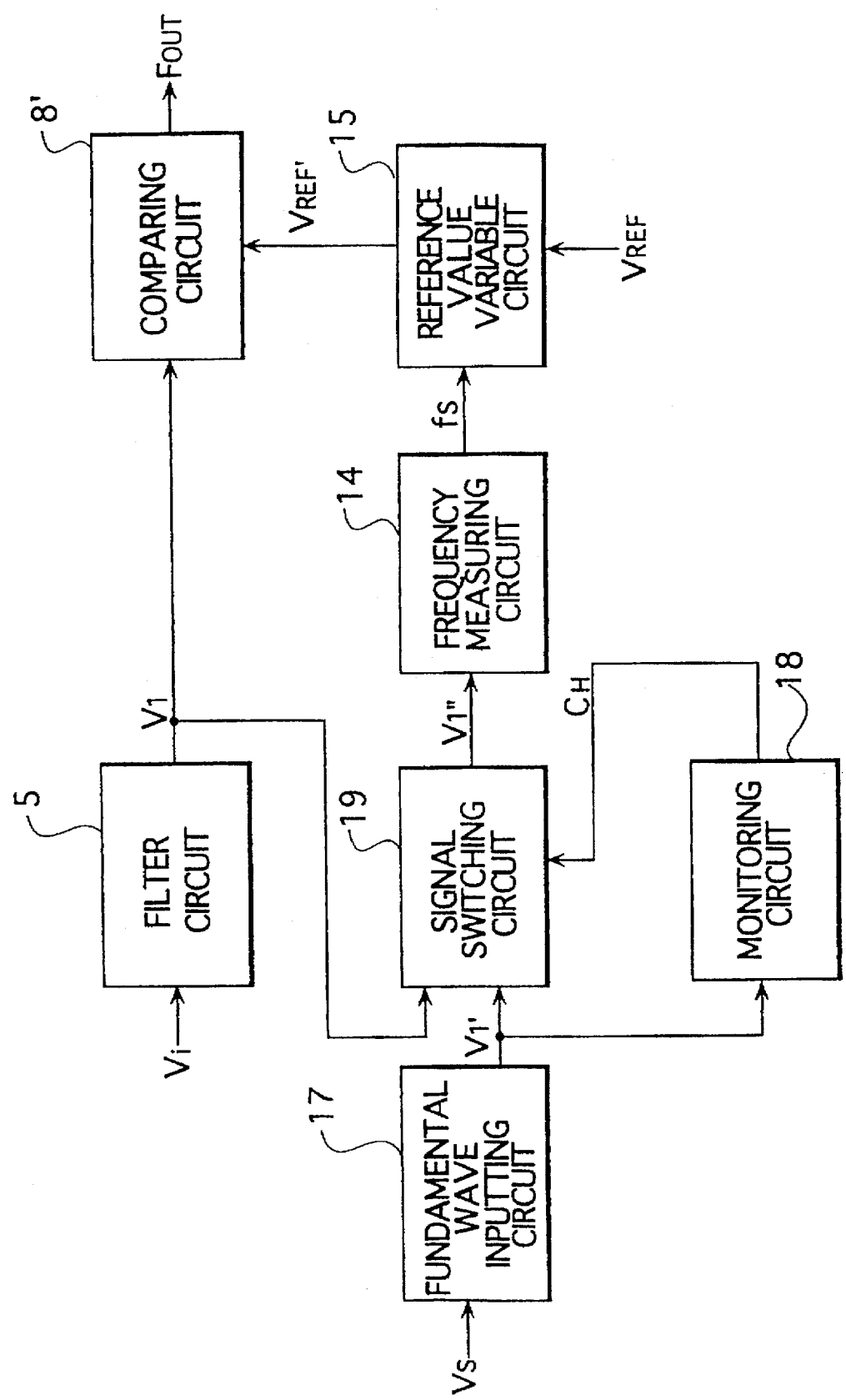
FIG. 17 is a block diagram showing another transformed example of the ground fault detecting portion.

In the ground fault detecting portion as shown in FIG. 17, the monitoring circuit 18 and the signal switching circuit 19 shown in FIG. 15 are formed in the ground fault detecting portion shown in FIG. 13, and takes same action and effect as the ground fault detecting portion shown in FIG. 15.

Figure 18:
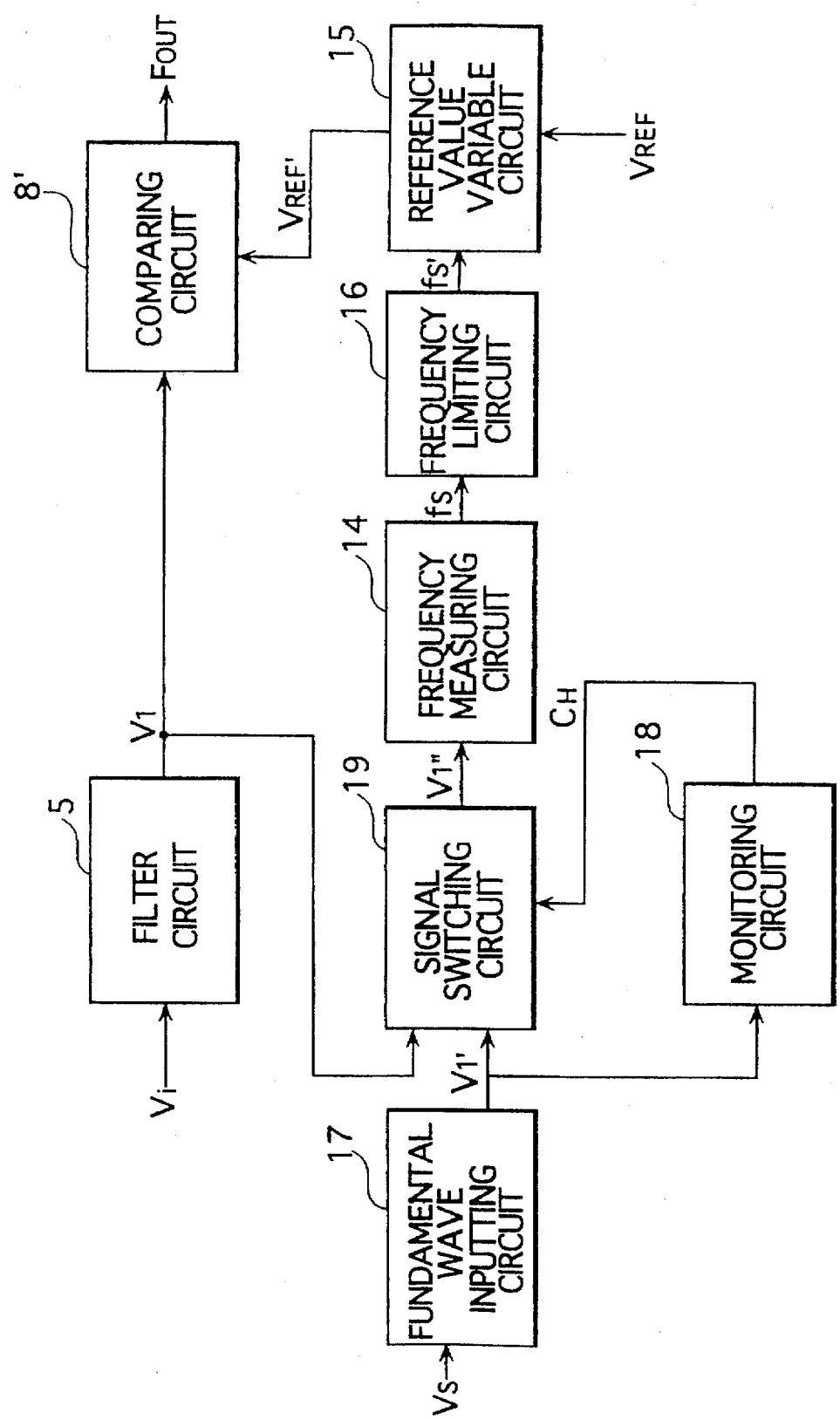
FIG. 18 is a block diagram showing another transformed example of the ground fault detecting portion.

In the ground fault detecting portion as shown in FIG. 18, the monitoring circuit 18 and the signal switching circuit 19 shown in FIG. 15 are formed in the ground fault detecting portion shown in FIG. 14, and takes same action and effect as the ground fault detecting portion shown in FIG. 15.

While above-mentioned embodiments of the present invention are applied to the system having the exciting circuit with an inverter circuit, it is to be understood that the present invention may be applied to other system having other type of exciting circuit.

Figure 19:
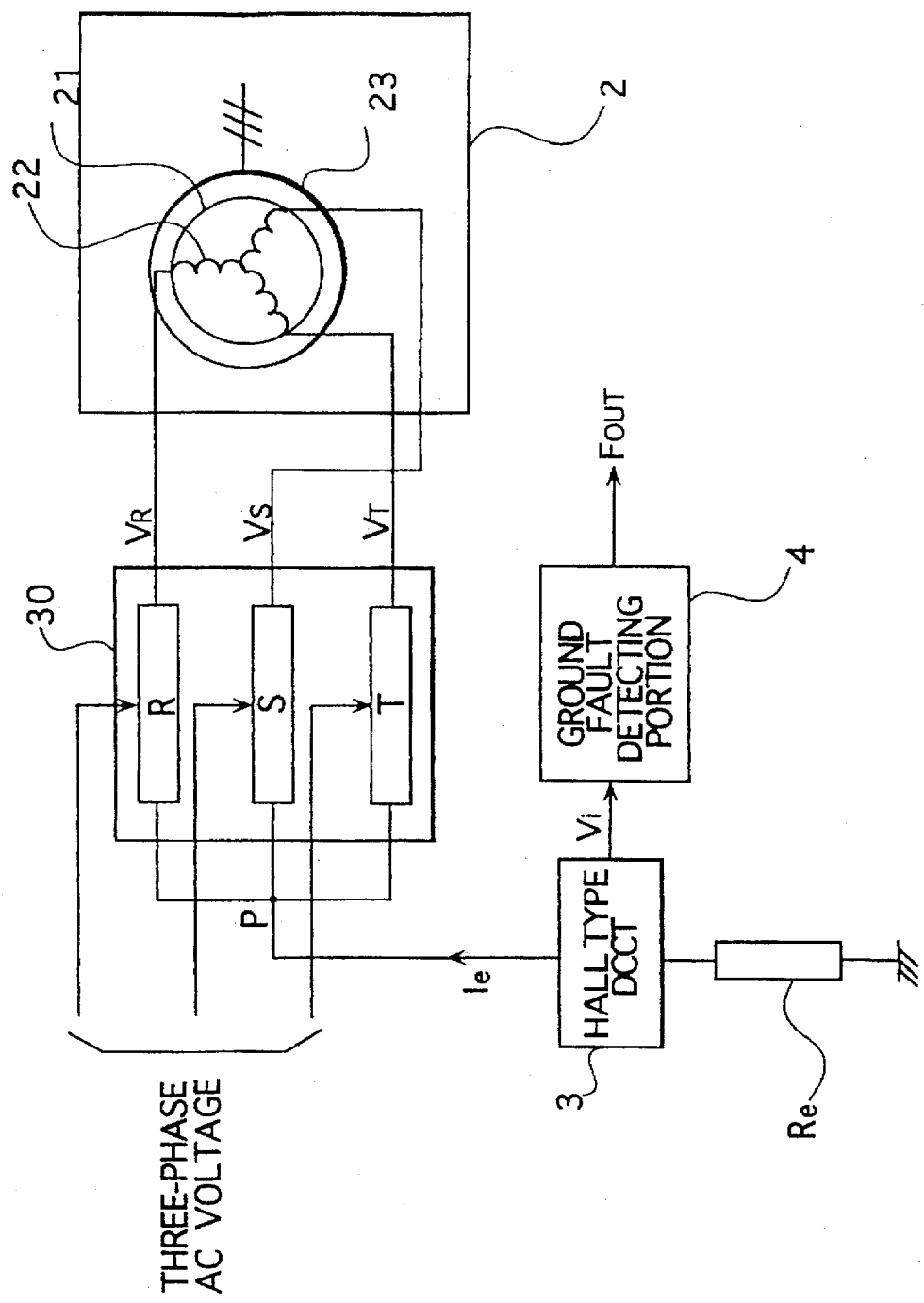
FIG. 19 is a schematic diagram showing a construction of a system according to another embodiment of the present invention.

FIG. 19 is another embodiment that the present invention is applied to a system having an exciting circuit with a cycloconverter.

As shown in FIG. 19, an exciting circuit 30 inputs the three-phase AC voltage and outputs the three-phase excited voltages VR, VS, VT that is PWM controlled having a neutral point. Other circuit construction of the system is same as the one shown in FIG. 1.

Figure 20:
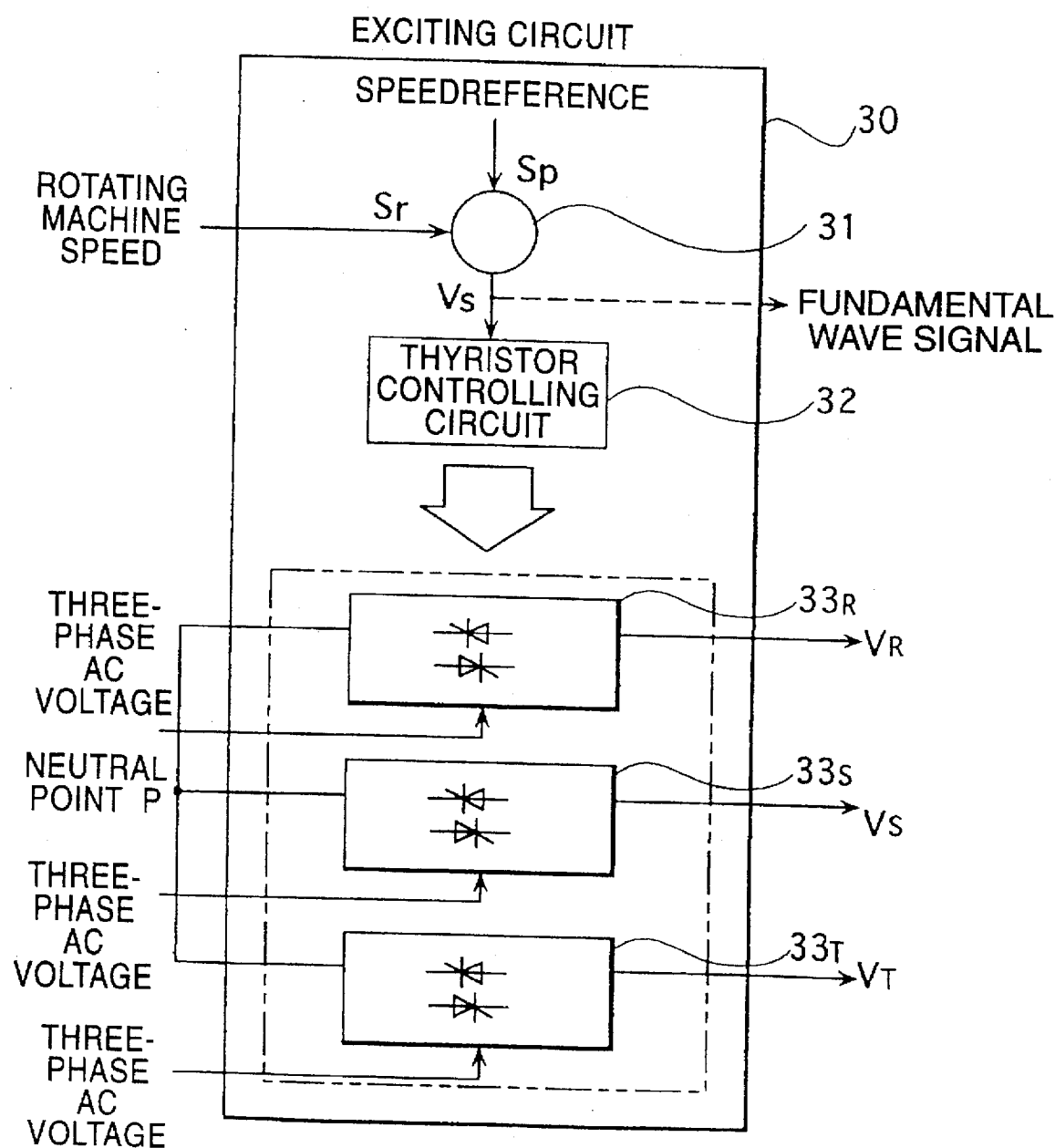
FIG. 20 is a block diagram showing a construction of an exciting circuit in FIG. 19.

FIG. 20 shows a construction of the exciting circuit 30.

Figure 21:
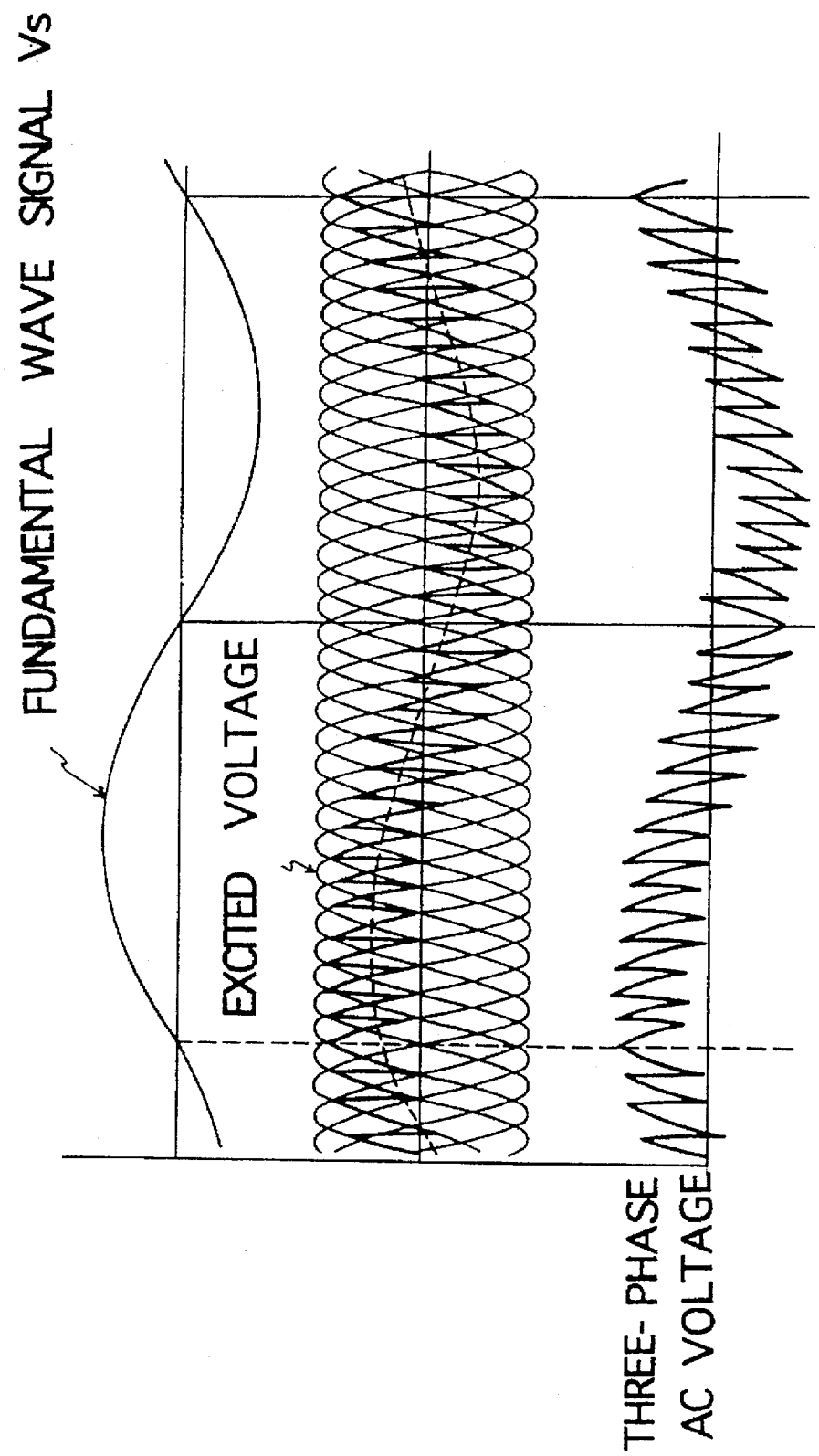
FIG. 21 is a schematic diagram showing waveforms of an excited voltage applied to an AC exciting variable speed rotating machine.

As shown in FIG. 20, a comparator 31 inputs the speed reference signal SP and the rotating machine speed signal SR and outputs the fundamental wave signal Vs corresponding to a difference between these signals. The speed reference signal SP is a signal, for example a frequency signal, inputted from a system, for example a power-transmission line in a power plant. The rotating machine speed signal SR is a signal based upon a rotating speed of the rotor 21. As shown in FIG. 21, a thyristor controlling circuit 32 inputs the fundamental wave signal Vs, generates a trigger signal based upon the fundamental wave signal Vs and outputs the trigger signal. A cycloconverter circuits 33R, 33S and 33T are connected in antiparallel two thyristors and convert three-phase AC voltages corresponding to the trigger signal to the excited voltages VR, VS and VT. A wave of the excited voltage as shown in FIG. 21 shows for example one period of the excited voltage VR. The excited voltages VR, VS and VT are hundreds Hz of sawtooth wave pulse voltages that amplitudes and frequencies are controlled by a PWM control corresponding to the fundamental wave signal as shown in FIG. 21.

The ground resistance Re and a Hall type DCCT 3 as a means for detecting a current are connected in series between a neutral point of the exciting circuit 1 and a ground. The Hall type DCCT 3 outputs the secondary output voltage Vi in proportion to the ground fault current Ie. The ground fault detecting portion 4 inputs the secondary output voltage Vi from the Hall type DCCT 3 and detects a ground fault based upon the inputted secondary output voltage Vi.

Figure 22:
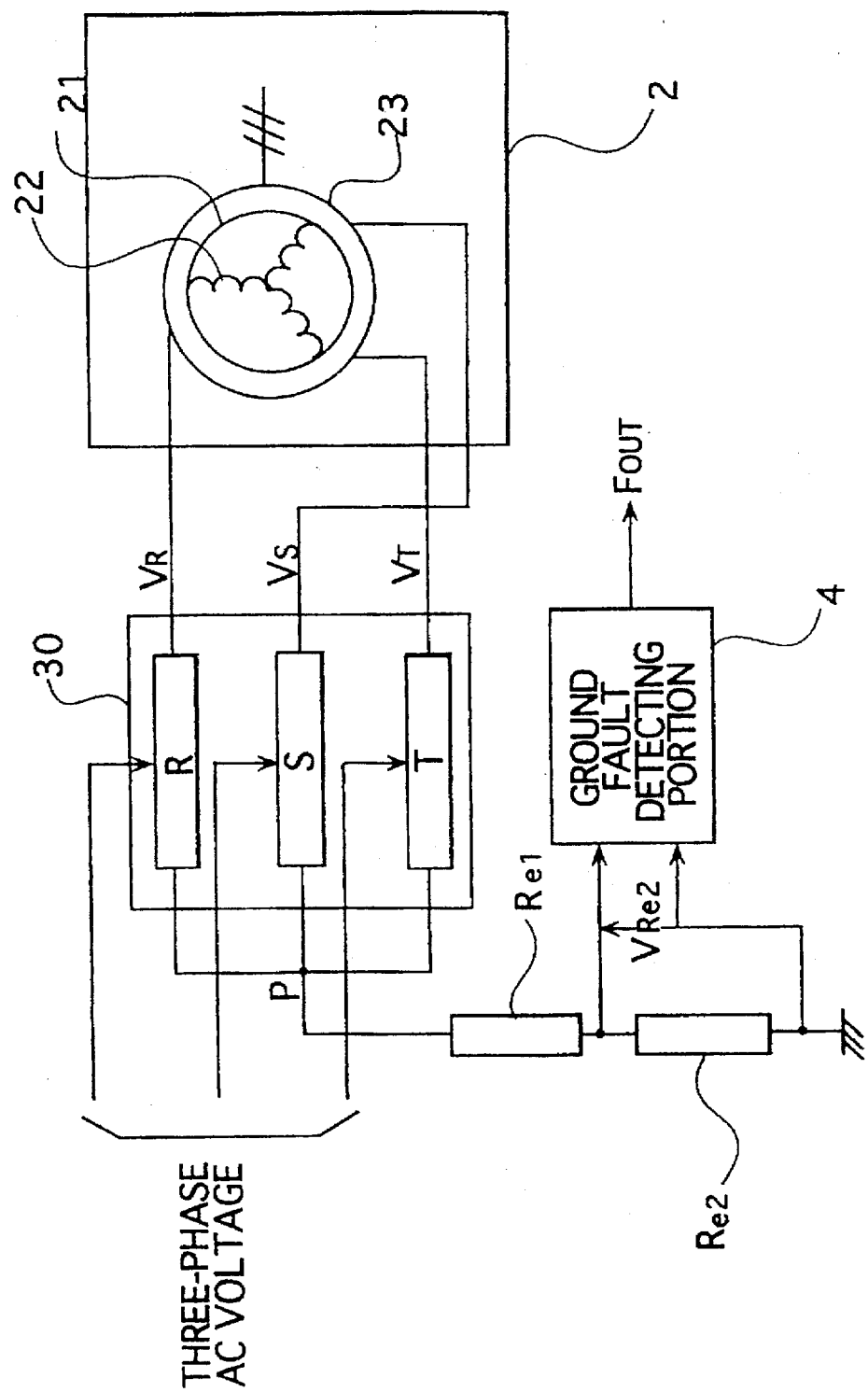
FIG. 22 is a schematic diagram showing a construction of a system according to another embodiment of the present invention.

In a system shown in FIG. 22, the ground fault detecting method shown in FIG. 5 is applied to the system having the exciting circuit 30 with the cycloconverter shown in FIG. 19. In other words, a resistance Re1 and a resistance Re2 are connected in series between a neutral point of the exciting circuit 30 and a ground. The system detects a voltage drop across both ends of the resistance Re2 in proportion to the ground fault current Ie, thereby detects a ground fault current Ie.

Having thereby described the subject matter of the present invention, it should be apparent that many substitutions, modification and variation of the invention are possible in light of the above teachings. It is therefore to be understood that the invention as taught and described herein is only to be limited to the extent of the breadth and scope of the appended claims.

What is claimed is:

1. An apparatus for detecting a ground fault on an exciting circuit and a field circuit of an AC excited variable speed rotating machine, the exciting circuit outputting an exciting voltage of controlled frequency and/or an amplitude, and the field circuit outputting a field current produced by the exciting voltage, the apparatus comprising:

a ground resistance connected between a neutral point of said field circuit and ground;

a current detecting means for detecting a ground current flowing between the ground and said neutral point through said ground resistance and outputting a detected signal; and a ground fault detecting means for extracting a component of a fundamental wave signal from the detected signal and for detecting said ground fault according to the extracted component and a frequency of the fundamental wave signal with constant detecting sensitivity regardless of a change of the exciting voltage, the fundamental wave signal controlling the frequency and/or an amplitude of the exciting voltage.

2. The apparatus as set forth in claim 1, wherein said current detecting means has a Hall type DCCT.

3. The apparatus as set forth in claim 1;

wherein said ground resistance has first resistance and second resistance connected in series; and said current detecting means detects a voltage drop in either the first resistance or the second resistance, and further detects a current flowing from the ground to said neutral point through said ground resistance according to the detected voltage drop.

4. The apparatus as set forth in claim 1, wherein said ground fault detecting means comprises:

a filter circuit for extracting the fundamental wave signal to control said frequency and/or said amplitude from the detected signal;

a period measuring circuit for measuring a period of the fundamental wave signal extracted by said filter circuit, and outputting a period signal corresponding to the measured period;

a variable amplifying circuit for amplifying an amplitude of the fundamental wave signal extracted by said filter circuit according to said period signal; and a comparing circuit for comparing an output of said variable amplifying circuit and a predetermined reference value, and outputting a ground fault detection signal when the output of said variable amplifying circuit exceeds said predetermined reference value.

5. The apparatus as set forth in claim 4, wherein said ground fault detecting means further comprises an amplitude limiting circuit for limiting a period of the period signal to a fixed higher limit value when the period of the period signal exceeds the higher limit value, for limiting the period of the period signal to a fixed lower limit value when the period of the period signal is below the lower limit value, and for outputting the limited period signal to said variable amplifying circuit.

6. The apparatus as set forth in claim 1, wherein said ground fault detecting means comprises:

a filter circuit for extracting the fundamental wave signal to control said frequency and/or said amplitude from the detected signal from said current detecting means;

a frequency measuring circuit for measuring a frequency of the fundamental wave signal extracted by said filter circuit, and outputting a frequency signal corresponding to the measured frequency;

a reference value variable circuit for varying a predetermined reference value corresponding to the frequency of said frequency signal; and a comparing circuit for comparing the fundamental wave signal extracted by said filter circuit and the reference value varied by the reference value variable circuit, and outputting a ground fault detection signal when said fundamental wave signal exceeds said varied reference value.

7. The apparatus as set forth in claim 6, wherein said ground fault detecting means further comprises a frequency limiting circuit for limiting a frequency of the frequency signal from said frequency measuring circuit to a fixed higher limit value when the frequency of the frequency signal exceeds the higher limit value, for limiting the frequency of the frequency signal to a fixed lower limit value when the frequency of the frequency signal is below the lower limit value, and for outputting the limited frequency signal to said reference value variable circuit.

8. The apparatus as set forth in claim 1, wherein said ground fault detecting means comprises:
- a filter circuit for extracting the fundamental wave signal from the detected signal from said current detecting means;
- a fundamental wave inputting circuit for inputting the fundamental wave signal to control said frequency and/or said amplitude directly from the exciting circuit;
- a period measuring circuit for measuring a period of the fundamental wave signal inputted by said fundamental wave inputting circuit, and outputting a period signal corresponding to the measured period;
- a variable amplifying circuit for amplifying the amplitude of the fundamental wave signal extracted by said filter circuit corresponding to said period signal; and
- a comparing circuit for comparing the output of said variable amplifying circuit and a predetermined reference value, and outputting ground fault detection signal when the output of said variable amplifying circuit exceeds said predetermined reference value.

9. The apparatus as set forth in claim 8, wherein said ground fault detecting means further comprises an amplitude limiting circuit for limiting a period of the period signal to a fixed higher limit value when the period of the period signal exceeds the higher limit value, for limiting the period of the period signal to a fixed lower limit value when the period of the period signal is below the lower limit value, and for outputting the limited period signal to said variable amplifying circuit.

10. The apparatus as set forth in claim 1, wherein said ground fault detecting means comprises:
- a filter circuit for extracting the fundamental wave signal from the detected signal from said current detecting means;
- a fundamental wave inputting circuit for inputting the fundamental wave signal to control said frequency and/or said amplitude directly from the exciting circuit;
- a frequency measuring circuit for measuring a frequency of the fundamental wave signal inputted by said fundamental wave inputting circuit, and outputting a frequency signal corresponding to the measured frequency;
- a reference value variable circuit for varying predetermined reference value corresponding to a frequency of said frequency signal; and
- a comparing circuit for comparing the fundamental wave signal extracted by said filter circuit and the reference value varied by the reference value variable circuit, and outputting a ground fault detection signal when said fundamental wave signal exceeds said varied reference value.

11. The apparatus as set forth in claim 10, wherein said ground fault detecting means further comprises a frequency limiting circuit for limiting a frequency of the frequency signal to a fixed higher limit value when the frequency of the frequency signal exceeds the higher limit value, for limiting the frequency of the frequency signal to a fixed lower limit value when the frequency of the inputted frequency signal is below the lower limit value, and for outputting the limited frequency signal to said reference value variable circuit.

12. The apparatus as set forth in claim 1, wherein said ground fault detecting means comprises:
- a filter circuit for extracting the fundamental wave signal from the detected signal;
- a fundamental wave inputting circuit for inputting the fundamental wave signal to control said frequency and/or said amplitude directly from the exciting circuit;
- a monitoring circuit for monitoring the fundamental wave signal inputted by said fundamental wave inputting circuit;
- a switching circuit for switching the fundamental wave signal extracted by said filter circuit to the fundamental wave signal inputted by said fundamental inputting circuit corresponding to a result monitored by said monitoring circuit;
- a period measuring circuit for measuring a period of the fundamental wave signal inputted by said switching circuit, and outputting a period signal corresponding to the measured period;
- a variable amplifying circuit for amplifying the amplitude of the fundamental wave signal extracted by said filter circuit in response to said period signal; and
- a comparing circuit for comparing the output of said variable amplifying circuit and a predetermined reference value, and outputting a ground fault detection signal when the output of said variable amplifying circuit exceeds said predetermined reference value.

13. The apparatus as set forth in claim 12, wherein said ground fault detecting means further comprises an amplitude limiting circuit for limiting a period of the period signal from said period measuring circuit to a fixed higher limit value when the period of the inputted period signal exceeds the higher limit value, for limiting the period of the period signal to a fixed lower limit value when the period of the period signal is below the lower limit value, and for outputting the limited period signal to said variable amplifying circuit.

14. The apparatus as set forth in claim 1, wherein said ground fault detecting means comprises:
- a filter circuit for extracting the fundamental wave signal from the detected signal;
- a fundamental wave inputting circuit for inputting the fundamental wave signal to control said frequency and/or said amplitude directly from the exciting circuit;
- a monitoring circuit for monitoring the fundamental wave signal inputted by said fundamental wave inputting circuit;
- a switching circuit for switching the fundamental wave signal extracted by said filter circuit to the fundamental wave signal inputted by said fundamental inputting circuit corresponding to a result monitored by said monitoring circuit;
- a frequency measuring circuit for measuring a frequency of the fundamental wave signal outputted by said switching circuit, and outputting a frequency signal corresponding to the measured frequency;
- a reference value variable circuit for varying a predetermined reference value in response to said frequency signal; and
- a comparing circuit for comparing the fundamental wave signal extracted by said filter circuit and the reference value varied by the reference value varying means, and outputting a ground fault detection signal when said fundamental wave signal exceeds said varied reference value.

15. The apparatus as set forth in claim 14, wherein said ground fault detecting means further comprises a frequency limiting circuit for limiting a frequency of the frequency signal that is inputted from said frequency measuring circuit to a fixed higher limit value when the frequency of the frequency signal exceeds the higher limit value, for limiting the frequency of the frequency signal to a fixed lower limit when the frequency of the frequency signal is below the lower limit value, and for outputting the limited frequency as a limited frequency signal to said reference value variable circuit.

16. The apparatus as set forth in claim 1, wherein said exciting circuit has an inverter that inputs a DC voltage based upon the neutral point.

17. The apparatus as set forth in claim 1, wherein said exciting circuit has a cycloconverter having the neutral point.

18. A method for detecting a ground fault on an exciting circuit and a field circuit of an AC excited variable speed rotating machine, the exciting circuit outputting an exciting voltage of controlled frequency and/or an amplitude, and the field circuit outputting a field current produced by the exciting voltage, the method comprising the steps of:

connecting a ground resistance between a neutral point of said exciting circuit and ground;

detecting a ground current flowing between the ground and the neutral point through said ground resistance by a Hall type DCCT;

extracting a component of a fundamental wave signal from the detected ground current, the fundamental wave signal controlling the frequency and/or amplitude of the exciting voltage; and detecting the ground fault according to the extracted component and a frequency of the fundamental wave signal.

* * * * *